US011909389B2

(12) United States Patent
Yamabayashi et al.

(10) Patent No.: US 11,909,389 B2
(45) Date of Patent: Feb. 20, 2024

(54) INPUT DEVICE AND INPUT SYSTEM

(71) Applicant: Panasonic Intellectual Property Management Co., Ltd., Osaka (JP)

(72) Inventors: Masaaki Yamabayashi, Okayama (JP); Yuta Saito, Okayama (JP); Kenichi Matsumoto, Okayama (JP); Ryo Nakae, Okayama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 262 days.

(21) Appl. No.: 17/604,479

(22) PCT Filed: Jun. 1, 2020

(86) PCT No.: PCT/JP2020/021552
§ 371 (c)(1),
(2) Date: Oct. 18, 2021

(87) PCT Pub. No.: WO2021/010037
PCT Pub. Date: Jan. 21, 2021

(65) Prior Publication Data
US 2022/0216868 A1    Jul. 7, 2022

(30) Foreign Application Priority Data

Jul. 17, 2019  (JP) .................................. 2019-132224

(51) Int. Cl.
*H03K 17/96* (2006.01)
*G06F 3/02* (2006.01)

(52) U.S. Cl.
CPC ............. *H03K 17/962* (2013.01); *G06F 3/02* (2013.01); *H03K 2217/96015* (2013.01)

(58) Field of Classification Search
CPC ...... H01H 3/125; H01H 13/705; H01H 13/14; H01H 13/04; H01H 13/10; H01H 13/70;
(Continued)

(56) References Cited

U.S. PATENT DOCUMENTS 10,804,897 B2 * 10/2020 Hu ........................ H03K 17/962
11,061,522 B2 *  7/2021 Taka ....................... G06F 3/0488
(Continued)

FOREIGN PATENT DOCUMENTS

CN      104350566 A    2/2015
EP        2860744 A1    4/2015
(Continued)

OTHER PUBLICATIONS

International Search Report of PCT application No. PCT/JP2020/021552 dated Aug. 25, 2020.
(Continued)

*Primary Examiner* — Ahmed M Saeed
(74) *Attorney, Agent, or Firm* — Rimon P.C.

(57) ABSTRACT

An input device includes a detection surface configured to be operated by an operation body, a first fixed electrode, a movable electrode, first and second terminals configured to be connected to an outside of the input device, and a direct-connection line electrically connecting the movable electrode to the second terminal via no capacitor. The movable electrode has a lower surface facing an upper surface of the first fixed electrode to be capacitively coupled to the first fixed electrode. The movable contact is displaceable to approach the first fixed electrode in response to a pressing of the detection surface by the operation body. The first terminal is configured to output, to the outside of the input device, a first electric signal containing a change in a capacitance between the first fixed electrode and the movable electrode. The second terminal is configured to output, (Continued)

from the movable electrode to the outside of the input device, a second electric signal containing a change in a capacitance between the operation body and the movable electrode. This input device improves the detection sensitivity to detect approximating or contacting the input device by the operation body.

14 Claims, 14 Drawing Sheets

(58) Field of Classification Search
CPC .............. H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20; H03K 17/962; H03K 17/975; H03K 17/955; H03K 2017/9613; H03K 2217/960745
See application file for complete search history.

(56) References Cited

U.S. PATENT DOCUMENTS

2014/0239739 A1\* 8/2014 Shibata ................ H03K 17/962
 307/113
2015/0090579 A1\* 4/2015 Kurikawa ............ H03K 17/962
 200/600

FOREIGN PATENT DOCUMENTS

| JP | 2012-004129 | 1/2012 |
| JP | 2014-123430 | 7/2014 |

OTHER PUBLICATIONS

English Translation of Chinese Search Report dated Sep. 26, 2023 for the related Chinese Patent Application No. 202080044261.7.

\* cited by examiner

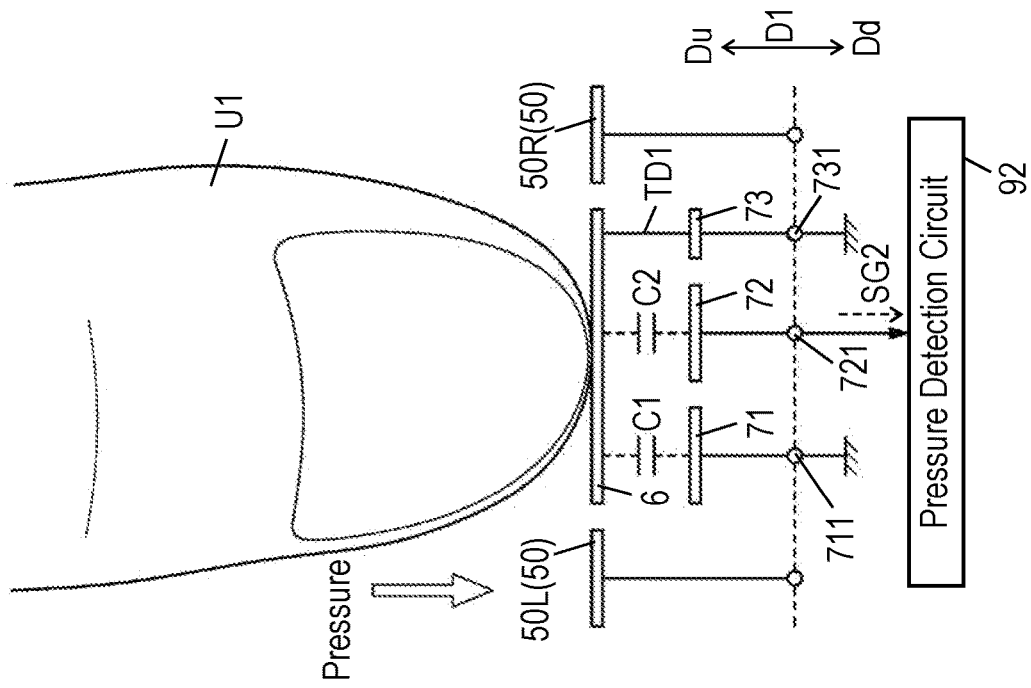
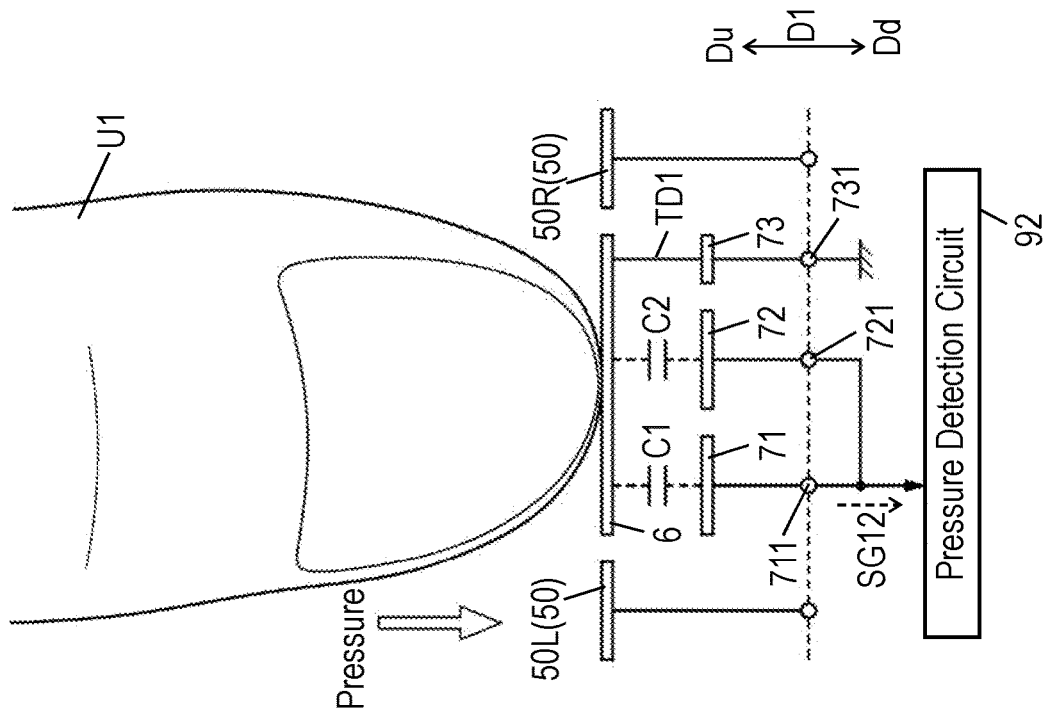

INPUT DEVICE AND INPUT SYSTEM

CROSS-REFERENCE TO RELATED APPLICATIONS

This application is a U.S. national stage application of the PCT international application No. PCT/JP2020/021552 filed on Jun. 1, 2020, which claims the benefit of foreign priority of Japanese patent application No. 2019-132224 filed on Jul. 17, 2019, the contents all of which are incorporated herein by reference.

TECHNICAL FIELD

The present disclosure relates to an input device used to input an operation to various electronic equipment, and to an input system including the input device.

BACKGROUND ART

PTL 1 discloses a conventional input device including a pressure sensor. The input device includes an elastic body and the pressure sensor disposed inside the elastic body. An operator presses the elastic body with a finger, which is an operation body, to cause the elastic body to elastically deform. The input device detects the elastic deformation of the elastic body by the pressure sensor, and outputs a result of detection as an electric signal.

The input devices may include a movable electrode and a fixed electrode provided inside the pressure sensor. In this case, a capacitance is formed between the movable electrode and the fixed electrode. The displacement of the movable electrode in response to the pressing by a finger changes the capacitance. An electric signal containing the change in the capacitance is output from the fixed electrode. The pressure sensor senses the pressing by the finger based on the electric signal output from the fixed electrode.

CITATION LIST

Patent Literature

PTL 1: Japanese Patent Laid-Open Publication No. 2012-004129

SUMMARY

An input device includes a detection surface configured to be operated by an operation body, a first fixed electrode, a movable electrode, first and second terminals configured to be connected to an outside of the input device, and a direct-connection line electrically connecting the movable electrode to the second terminal via no capacitor. The movable electrode has a lower surface facing an upper surface of the first fixed electrode to be capacitively coupled to the first fixed electrode. The movable contact is displaceable to approach the first fixed electrode in response to a pressing of the detection surface by the operation body. The first terminal is configured to output, to the outside of the input device, a first electric signal containing a change in a capacitance between the first fixed electrode and the movable electrode. The second terminal is configured to output, from the movable electrode to the outside of the input device, a second electric signal containing a change in a capacitance between the operation body and the movable electrode.

This input device improves the detection sensitivity to detect approximating or contacting the input device by the operation body.

BRIEF DESCRIPTION OF DRAWINGS

FIG. 9A schematically illustrates an operation of a pressure-detection process of the input system according to the embodiment.

FIG. 9B schematically illustrates another operation of the pressure-detection process of the input system according to the embodiment.

DESCRIPTION OF EMBODIMENTS

Each of the figures explained in the following exemplary embodiment is schematically drawn. Therefore, the ratio of the size and thickness of each component in each Figure does not necessarily reflect the actual dimensional ratio.

(1) Entire Structure

Figure 1:
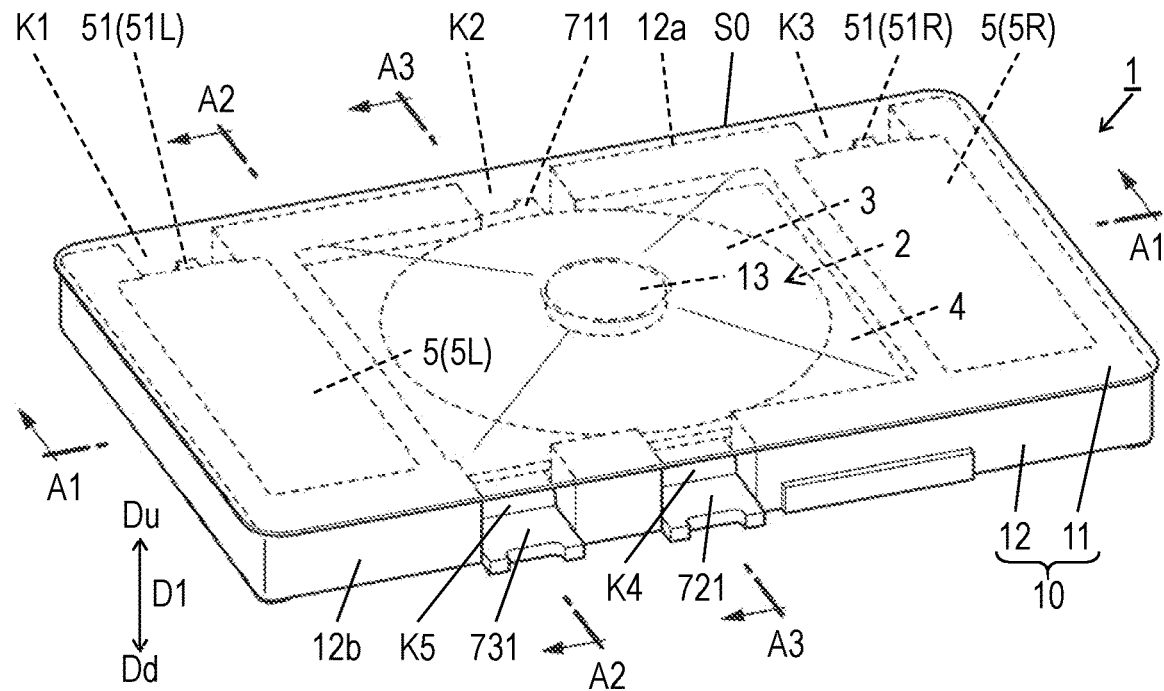
FIG. 1 is a perspective view of an input device according to an exemplary embodiment.
Figure 2:
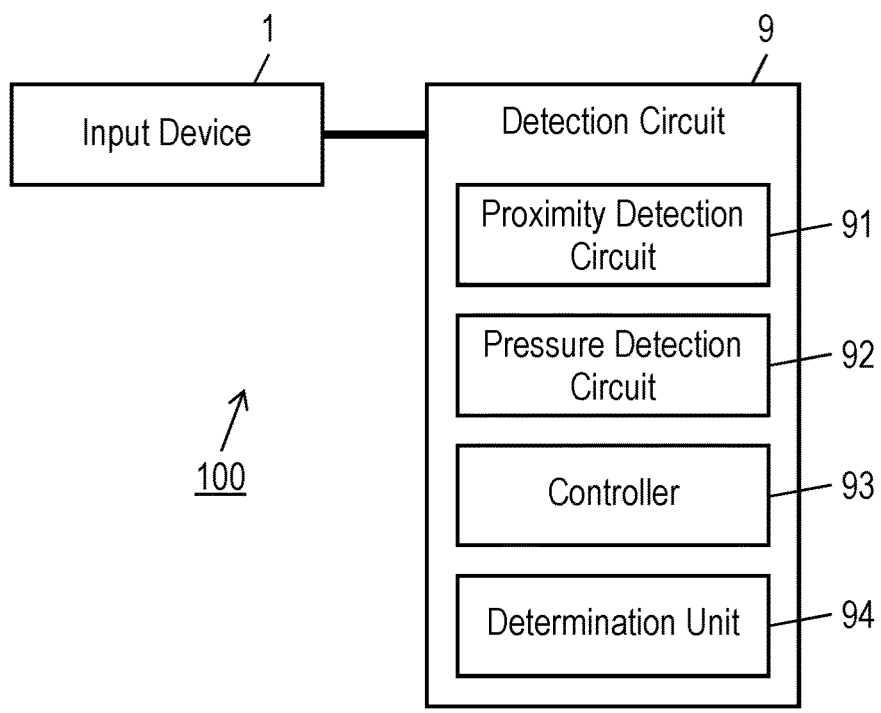
FIG. 2 is a schematic block diagram of an input system according to the embodiment.

An entire structure of input device 1 and input system 100 according to an exemplary embodiment will be described below. FIG. 1 is a perspective view of input device 1. FIG. 2 is a schematic block diagram of input system 100.

Input system 100 includes input device 1 and detection circuit 9, as shown in FIGS. 1 and 2.

Input system 100 is applicable to various electronic equipment. Input system 100 is configured to receive an operation made by operation body U1, determine a manipulation input by operation body U1, and output a result of the determination to an outside of the input device, e.g., a circuit module inside the electronic equipment having input system 100 installed therein. T manipulation input by operation body U1 include, for example, the pressing of detection surface S0 of input device 1 by operation body U1, approximating and contacting of detection surface S0 by operation body U1.

The approximating means that operation body U1 approximating detection surface S0 without contacting detection surface S0. The contacting means that operation body U1 contacts detection surface S0 without causing detection surface S0 to elastically deform. The pressing means that operation body U1 presses detection surface S0 to cause detection surface S0 to elastically deform.

Detection surface S0 of input device 1 is directed in upward direction Du in FIG. 1, an actual direction of detection surface S0 may not necessarily be this direction. Operation body U1 is, for example, a human fingertip (a part of a living body), operation body U1 may not be limited to the human fingertip. Operation body U1 may include a part of a living body and a device, such as a glove, covering the part of the living body. Operation body U1 may include a device, such as a pen-type manipulator, held by a living body. Input device 1 may not only be directly pressed or touched by operation body U1, but also be indirectly pressed or touched by operation body U1 via an operation plate disposed above detection surface S0.

Input device 1 accepts an operation input by operation body U1 and outputs an electric signal corresponding to the input operation to an outside, such as detection circuit 9, of input device 1. Input device 1 may be held in a housing of electronic equipment.

Detection circuit 9 is configured to determine a manipulation of an operation input by operation body U1 to input device 1 based on the electric signal output from input device 1, and to output a result of the determination to an outside of input system 100, such as a circuit module in the electronic equipment. Detection circuit 9 may be enclosed inside the housing of the electronic equipment.

(2) Input Device

Figure 3:
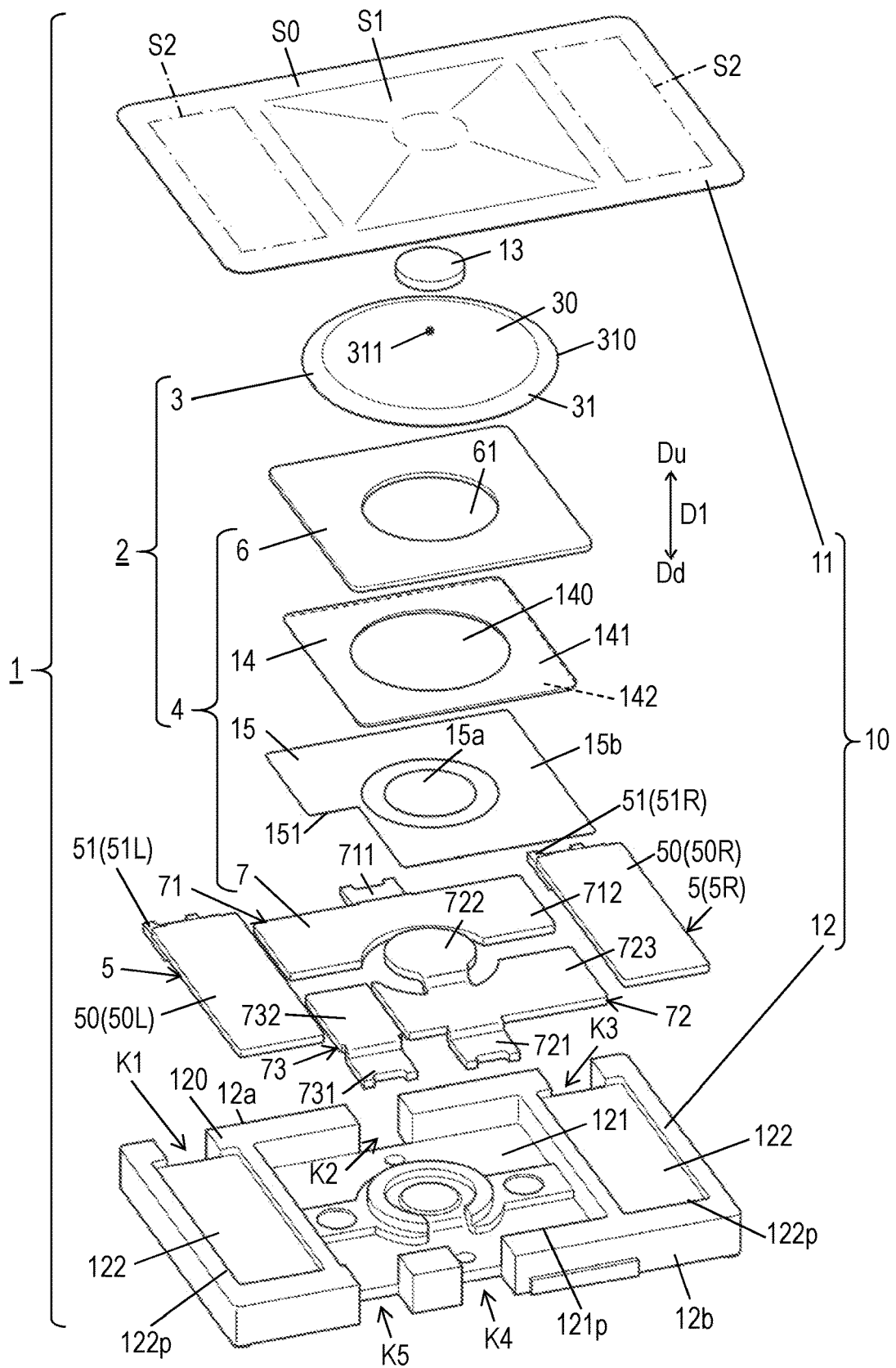
FIG. 3 is an exploded perspective view of the input device according to the embodiment.

FIG. 3 is an exploded perspective view of input device 1. As shown in FIG. 3, input device 1 includes pressure-sensitive part 2, one or more detection parts 5, housing 10, and push member 13. The number of detection parts 5 is two as an example.

(2.1) Housing

Housing 10 of input device 1 constitutes an outer shell accommodating pressure-sensitive part 2, two detection parts 5, and push member 13 therein, as shown in FIGS. 1 and 3. Housing 10 includes cover 11 and body 12. Body 12 has a box shape having, for example, a flat rectangular shape (e.g., a square shape). Openings 121p and 122p are provided in upper surface 120 of body 12. Cover 11 is made of a film having, for example, a rectangular shape (e.g., a square shape). Cover 11 is mounted onto upper surface 120 of body 12 so as to cover openings 121p and 122p of body 12.

Cover 11 and body 12 have an electrical insulation property. Cover 11 and body 12 may be made of, for example, resin material having an electrical insulation property. Particularly, cover 11 is flexible, consequently allowing operation body U1 (refer to FIG. 1) to press, via cover 11, pressure-sensitive part 2 accommodated in housing 10.

Pressure-sensitive part 2 and two detection parts 5 are provided on a lower surface of cover 11. The upper surface of cover 11 opposite to the lower surface thereof constitutes detection surface S0 of input device 1. A region of detection surface S0 of input device 1 positioned above pressure-sensitive part 2 to correspond to pressure-sensitive part 2 will be referred to as detection surface S1, and two respective regions of detection surface S0 that are positioned above two detection parts 5 to correspond to two detection parts 5 will be referred to as detection surfaces S2 below. Detection surfaces S1 and S2 are virtually denoted by dashed-dotted lines in FIG. 3.

Detection surface S0 may have, for example, substantially a rectangular shape. Detection surface S0 is a convex surface slightly protruding in upward direction Du, or in a direction away from pressure-sensitive part 2. Detection surface S1 may be, for example, substantially a square region. Detection surface S1 is positioned at the center of detection surface S0 in a longitudinal direction of detection surface S0. Detection surface S1 has a circular flat region at the center of detection surface S1. Push member 13 is stably positioned on the lower surface of cover 11 at a position at the center of detection surface S1. Each of two detection surfaces S2 is a region having substantially a rectangular shape. Two detection surfaces S2 are positioned at both sides of detection surface S1 in the longitudinal direction of detection surface S0, respectively.

Accommodating recess 121 opened at opening 121p and two accommodating recesses 122 respectively opened at openings 122p are provided in upper surface 120 of body 12. Accommodating recess 121 accommodates pressure detection part 2 therein. Each of two accommodating recesses 122 accommodates a corresponding one of two detection parts 5, therein.

Accommodating recess 121 and two accommodating recesses 122 are arranged in the order of one accommodating recess 122, accommodating recess 121 and the other accommodating recess 122 in the longitudinal direction of housing 10. Detection parts 5 is arranged adjacent to detection part 2 in housing 10 when viewed from above detection part 2, or from above pressing surface 30. Two detection parts 5 are disposed at both sides of pressure-sensitive part 2 so that pressure-sensitive part 2 is positioned between two detection parts 5 when viewed from above pressure-sensitive part 2.

Depths of two accommodating recesses 122 are identical to each other. The depth of accommodating recess 121 is larger than the depths of two accommodating recesses 122. Body 12 has five openings K1-K5 therein. Openings K1-K3 are provided in side surface 12a of body 12. Openings K4 and K5 are provided in side surface 12b of body 12 opposite to side surface 12a. Side surfaces 12a and 12b are a pair of side surfaces extending in the longitudinal direction of body 12. Respective terminals 51, 711, 721 and 731 of fixed electrodes 50, 71, 72 and 73 are lead out from the inside to the outside of body 12 through openings K1-K5.

(2.2) Pressure-Sensitive Part Pressure-sensitive part 2 is configured to sense a pressure applied by operation body U1 to detection surface S1 in detection surface S0 of input device 1, as shown in FIGS. 1 and 3. Pressure-sensitive part 2 includes click part 3, pressure sensor 4, and direct-connection line TD1. Pressure sensor 4 is a capacitive sensor. Pressure sensor 4 is configured to output an analog electric signal containing a change in a capacitance generated between movable electrode 6 and fixed electrode 7.

Pressure sensor 4 is disposed opposite to pressing surface 30 of click part 3 (below click part 3 in FIG. 3). Specifically, pressure sensor 4 includes movable electrode 6, elastic body 14, insulator 15, and fixed electrode 7. Insulator 15 has a sheet shape. Movable electrode 6, elastic body 14, insulator 15, and fixed electrode 7 are arranged in this order in a direction away from click part 3. Movable electrode 6 is closest to click part 3 among the components of pressure sensor 4.

Figure 4:
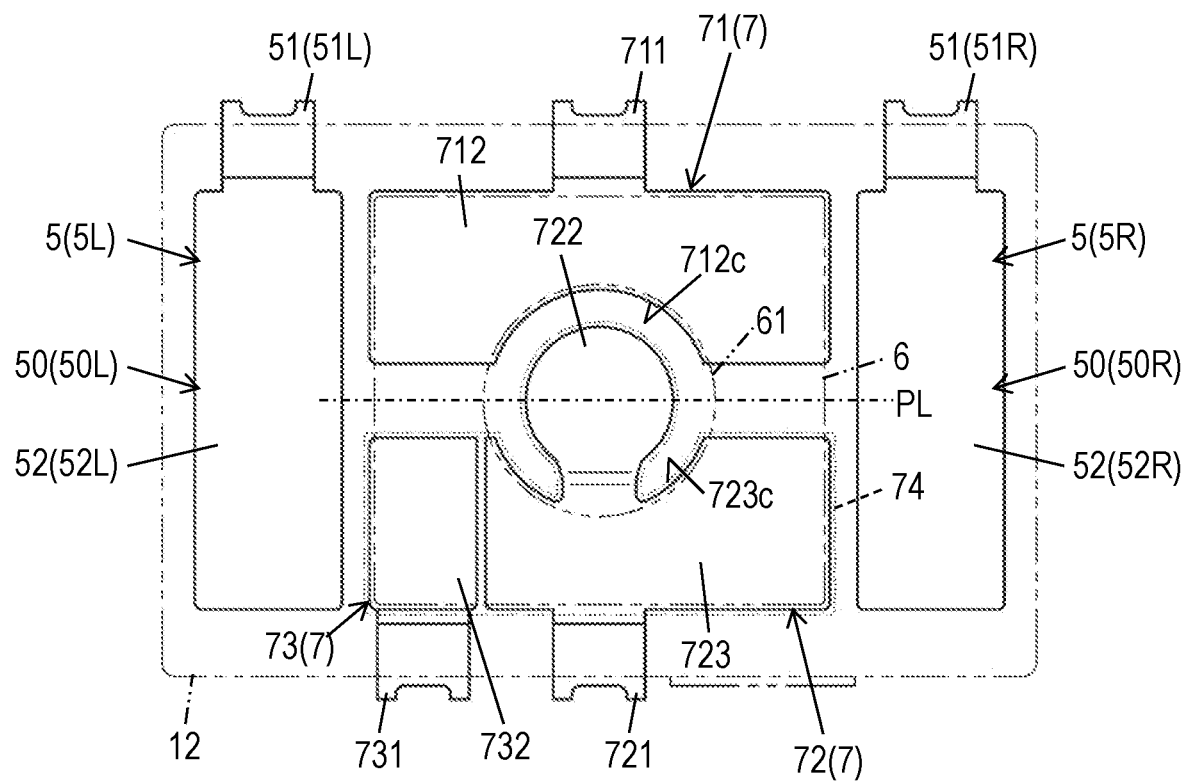
FIG. 4 is a plan view of a fixed electrode of the input device according to the embodiment.
Figure 5:
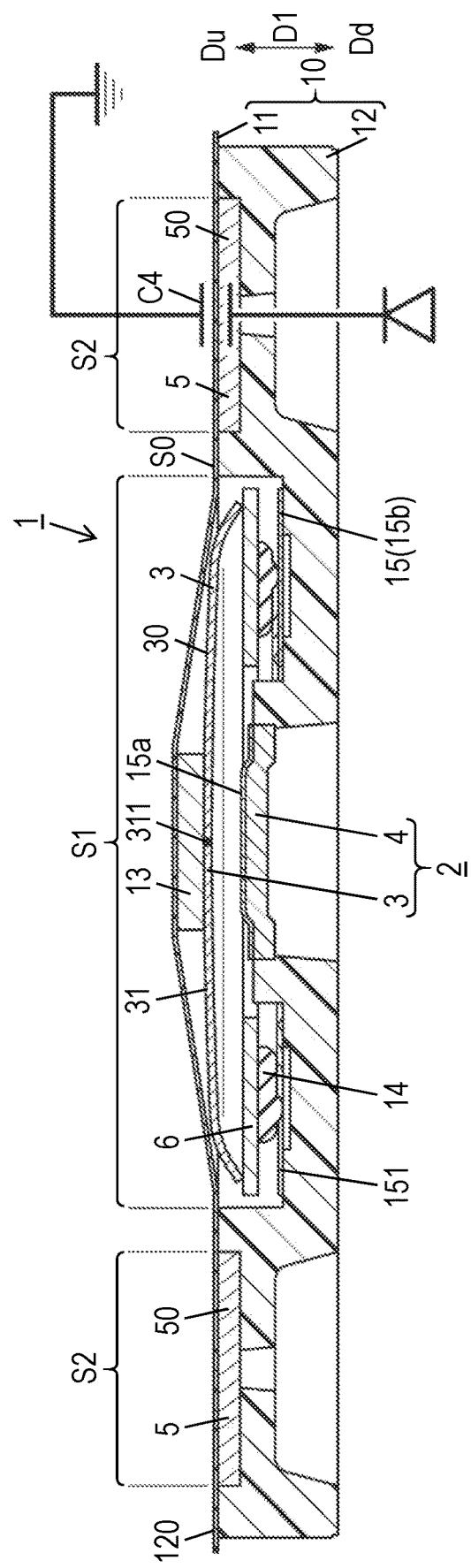
FIG. 5 is a schematic sectional view of the input device along line A1-A1 shown in FIG. 1.

FIG. 4 is a plan view of fixed electrode 7. FIG. 5 is a schematic sectional view of input device 1 along line A1-A1 shown in FIG. 1. Movable electrode 6 is movable (displaceable) with respect to fixed electrode 7 in downward direction Dd (upward and downward directions D1, or a displacing direction) by pressing detection surface S0 of input device 1 in downward direction Dd with operation body U1. In accordance with the embodiment, movable electrode 6 is movable in its thickness direction, or upward direction Du (downward direction Dd), or in the thickness direction of housing 10. In other words, each of upward and downward directions D1 is the thickness direction of movable electrode 6. Movable electrode 6 moves against the elastic force of elastic body 14 in downward direction Dd toward fixed electrode 7 by the above-mentioned pressing operation. After that, when the above-mentioned pressing operation is released, Movable electrode 6 is displaced in upward direction Du toward click part 3 by the elastic force of elastic body 14 to return to the original position.

Movable electrode 6 is made of an electric, conductive material, such as a metal plate, having a rectangular plate shape. Hole 61 passes through the center of movable electrode 6 in the thickness direction, or in upward and downward directions D1. Hole 61 has a substantially circular shape and is opened as viewed from above movable electrode 6.

Fixed electrode 7 is made of electrically-conductive material, such as gold, and has substantially a rectangular flat plate shape as a whole. Fixed electrode 7 in accordance with the embodiment is divided to three pieces: fixed electrodes 71, 72 and 73. In other words, fixed electrodes 71, 72 and 73 face movable electrode 6 across elastic body 14 and insulator 15. Fixed electrodes 71, 72 and 73 are substantially flush with the same plane. Fixed electrode 7, i.e., each of fixed electrodes 71, 72 and 73, is fixed onto a bottom surface of accommodating recess 121 of body 12.

Fixed electrode 7 may be regarded as that fixed electrode 7 is divided to two divisional pieces: fixed electrodes 71 and 74, and that fixed electrode 74 is further divided to two divisional pieces: fixed electrodes 72 and 73 (see FIG. 4). In other words, fixed electrode 7 includes fixed electrodes 71 and 74 which are divisional pieces of fixed electrode 7. Fixed electrode 74 which itself is a divisional piece of fixed electrode 7 is composed of fixed electrodes 72 and 73 which are divisional pieces.

Fixed electrode 71 has substantially a rectangular plate shape. Fixed electrode 71 in ludes main body 712 and terminal 711 which is an output part. Main body 712 has substantially a rectangular plate shape. Main body 712 has semi-circular cutout 712c in the center of an edge thereof facing fixed electrode 72. Terminal 711 is an output part outputting analog electric signal SG1 containing a change in a capacitance between movable electrode 6 and fixed electrode 71 to an outside of input device 1. Terminal 711 is provided at an edge of main body 712 which is opposite to the edge of main body 712 having the cutout provided therein, and projects from main body 712 substantially in a direction away from fixed electrode 72.

Fixed electrode 71 is disposed in accommodating recess 121 of body 12. In detail, main body 712 is disposed on the bottom surface of accommodating recess 121 so that almost only the upper surface out of the surfaces of main body 712 is exposed from the bottom surface of accommodating recess 121. Terminal 711 projects from body 12 through opening K2 provided in side surface 12a of body 12.

Fixed electrodes 71 and 72 are arranged, for example, in a width direction perpendicular to the longitudinal direction and the thickness direction (upward and downward directions D1) of housing 10. This arranging direction is perpendicular to both the thickness direction of housing 10 and the direction in which pressure-sensitive part 2 and detection parts 5 are arranged.

Fixed electrode 72 has substantially a rectangular plate shape. Fixed electrode 72 has main body 723, tongue 722, and terminal 721 which is an output part. The length of main body 723 in the longitudinal direction of housing 10 is shorter than the length of main body 712 of fixed electrode 71 in the longitudinal direction of housing 10. Semi-circular cutout 723c is provided in an edge of main body 723 facing fixed electrode 71. Cutout 723c of main body 723 faces cutout 712c of main body 712 of fixed electrode 71 so that cutouts 712c and 723c form substantially a circular shape as a whole. Terminal 721 is an output part outputting analog electric signal SG2 containing a change in a capacitance between movable electrode 6 and fixed electrode 72 to the outside of input device 1. Terminal 721 is provided at an edge of main body 723 opposite to the edge of main body 723 having cutout 723c provided therein. Terminal 721 projects from main body 723 substantially in a direction away from fixed electrode 71.

Tongue 722 is connected to main body 723 at cutout 723c of fixed electrode 72, and projects toward fixed electrode 71 when viewed from above. Tongue 722 has substantially a circular plate shape. The position of tongue 722 in the thickness direction of movable electrode 6 (upward and downward directions D1) is different from the position of the rectangular main body 723 of fixed electrode 72 in the thickness direction. That is, when viewed in a direction perpendicular to upward and downward directions D1, the position of tongue 722 deviates from the position of main body 723 of fixed electrode 72 along upward and downward directions D1. Tongue 722 is slightly bent to extend in the direction approaching click part 3 and further extend parallel to the upper surface of main body 723. A surface of tongue 722 is positioned substantially within hole 61 of movable electrode 6 (see FIG. 4). Apex portion 311 of dome body 31 of click part 3 contacts tongue 722 through insulator 15 (see FIG. 3).

Fixed electrode 72 is disposed on the bottom surface of accommodating recess 121. In detail, main body 723 and tongue 722 are disposed on the bottom surface of accommodating recess 121. Only the upper surfaces of main body 723 and tongue 722 out of the surfaces of main body 723 and tongue 722 are exposed from the bottom surface of accommodating recess 121. Terminal 721 projects to the outside of body 12 from opening K4 provided in side surface 12b of body 12.

Fixed electrode 73 has substantially a rectangular plate shape. Fixed electrode 73 includes main body 732 and terminal 731. Main body 732 has substantially a rectangular plate shape. The length of main body 732 in the longitudinal direction of housing 10 is smaller than the length of main body 712 of fixed electrode 71 in the same direction. The width of main body 732 in the width direction perpendicular to both the longitudinal direction and the thickness direction (upward and downward directions D1) of housing 10 is substantially identical to the width of main body 723 of fixed electrode 72 in the width direction. Terminal 731 is an output part outputting analog electric signal SG3 containing a change in a capacitance between movable electrode 6 and operation body U1 to the outside of input device 1. Terminal 731 projects d from main body 732 substantially in a direction away from fixed electrode 71.

Fixed electrode 73 is disposed on the bottom surface of accommodating recess 121. In detail, main body 732 is disposed on the bottom surface of accommodating recess 121. Almost only the upper surface of main body 732 out of the surfaces of main body 732 is exposed from the bottom surface of accommodating recess 121. Terminal 731 projects to the outside of body 12 from opening K5 provided in side surface 12b of body 12.

In accordance with the embodiment, as shown in FIG. 4, the entire shape composed of main bodies 723 and 732 of fixed electrodes 72 and 73 in plan view is plane symmetrical to the shape of main body 712 of fixed electrode 71 in plan view with respect to virtual plane PL that is positioned between fixed electrode 71 and each of fixed electrodes 72 and 73 and that extends in both the longitudinal direction and the thickness direction (upward and downward directions D1).

Elastic body 14 has, for example, a rectangular sheet shape, as shown in FIG. 3. Elastic body 14 has electrical conductivity. Elastic body 14 may be made of, for example, an electrically-conductive rubber sheet. Elastic body 14 has hole 140 provided therein at the center thereof and passing through elastic boy 14 penetrating in the thickness direction. Hole 140 has substantially a circular shape and opens when viewed from upper surface 141 of elastic body 14. The outer shape of elastic body 14 is substantially identical to the outer shape of movable electrode 6. The thickness of elastic body 14 is substantially identical to the thickness of movable electrode 6. The diameter of hole 140 is almost identical to the diameter of hole 61 of movable electrode 6. Upper surface 141 of elastic body 14 substantially surface-contacts lower surface of movable electrode 6.

Insulator 15 is made of insulative (dielectric) material, and has, for example, a rectangular sheet shape, as shown in FIG. 3. The outer shape of insulator 15 is almost identical to the outer shape of movable electrode 6. Insulator 15 has cutout 151 therein. Cutout 151 is provided at one of the four corners of the rectangular shape of the insulator. Cutout 151 is provided at a position corresponding to main body 732 of fixed electrode 73, or above main body 732. The shape of cutout 151 is almost identical to the shape of main body 732, and has, e.g. substantially a rectangular shape. In accordance with the embodiment, the thickness of insulator 15 is smaller than the thickness of movable electrode 6.

Insulator 15 is separated to central portion 15a and main body 15b. Central portion 15a overlaps tongue 722 of fixed electrode 7, and has, for example, a circular shape. Central portion 15a separated from main body 15b is easy disposed along the shape of the upper surface of tongue 722. Insulator 15 includes central portion 15a in accordance with the embodiment, insulator 165 may not necessarily include central portion 15a.

Insulator 15 is disposed between movable electrode 6 and fixed electrode 7. Insulator 15 covers the upper surface of main body 712 of fixed electrode 71 and the upper surfaces of main body 723 and tongue 722 of fixed electrode 72 which are surfaces exposed from the bottom surface of accommodating recess 121. The upper surface of main body 732 of fixed electrode 73 exposed from the bottom surface of accommodating recess 121 is exposed from cutout 151 provided in insulator 15. This configuration allows elastic body 14 to electrically contact fixed electrode 73 through cutout 151 of insulator 15, thus allowing movable electrode 6 to electrically contact fixed electrode 73 elastic body 14 via no capacitor.

In order to allow elastic body 14 electrically contact fixed electrode 73 securely, elastic body 14 may include a projection projecting toward fixed electrode 73 from a portion of elastic body 14 contacting fixed electrode 73. Fixed electrode 73 may include a projection projecting toward elastic body 14 from a portion of fixed electrode 73 contacting elastic body 14. Even in the case that a gap corresponding to the thickness of insulator 15 is produced between elastic body 14 and the fixed electrode 73, the above-described projection allows elastic body 14 to electrically and securely contact fixed electrode 73.

Click part 3 has pressing surface 30 which is an upper surface thereof, and is configured to provide operation body U1 that presses pressing surface 30 with a click feeling of touch. Click part 3 deforms elastically. Click part 3 includes dome body 31 made of a dome-shaped plate having an upper surface constituting pressing surface 30. Dome body 31 is made of an elastic material, such as a metal plate. Dome body 31 is a so-called metal dome.

Pressing surface 30 of click part 3 is a convex surface. Pressing force P1 applied by operation body U1 to pressing surface 30 causes click part 3 to elastically deform and generate a click feeling. In detail, this elastic deformation causes the central portion of dome body 31 to be reversed from the convex shape to a concave shape (buckling). When the pressing force is applied to pressing surface 30, click part 3 reacts to have pressing surface 30 elastically deform to sag downward to provide operation body U1 with the click feeling.

Dome body 31 includes circumferential portion 310 and apex portion 311, as shown in FIG. 3. Dome body 31 is disposed on the upper surface of movable electrode 6 of pressure sensor 4.

In response to the pressing of dome body 31 by operation body U1, circumferential portion 310 of dome body 31 presses movable electrode 6 toward fixed electrode 7. In other words, movable electrode 6 receiving the pressing force through dome body 31 moves in downward direction Dd to approach fixed electrode 7 while pressing elastic body 14 and insulator 15. When dome body 31 is buckled in response to the pressing force from operation body U1, apex portion 311 moves through hole 61 of movable electrode 6 to approach tongue 722 of fixed electrode 7 and contact a portion of insulator 15 located above tongue 722 to press tongue 722 in downward direction Dd. In other words, apex portion 311 presses tongue 722 via insulator 15.

Push member 13 is configured to cause click part 3 to elastically deform easily. Push member 13 has a disk shape, as shown in FIG. 3. The outer shape of push member 13 is smaller than the outer shape of click part 3. Push member 13 is disposed between apex portion 311 of dome body 31 and cover 11 (see FIG. 5). Push member 13 may be fixed to cover 11 or click part 3. Push member 13 is preferably fixed to cover 11. Push member 13 has an electrical insulation property.

Direct-connection line TD1 electrically connects movable electrode 6 to terminal 731 via no capacitor to electrically connect movable electrode 6 to detection circuit 9 via no capacitor. Direct-connection line TD1 outputs analog electric signal SG3 from movable electrode 6 to detection circuit

9. Direct-connection line TD1 includes elastic body 14 and a part of fixed electrode 73, i.e., main body 732 and terminal 731.

Figure 6:
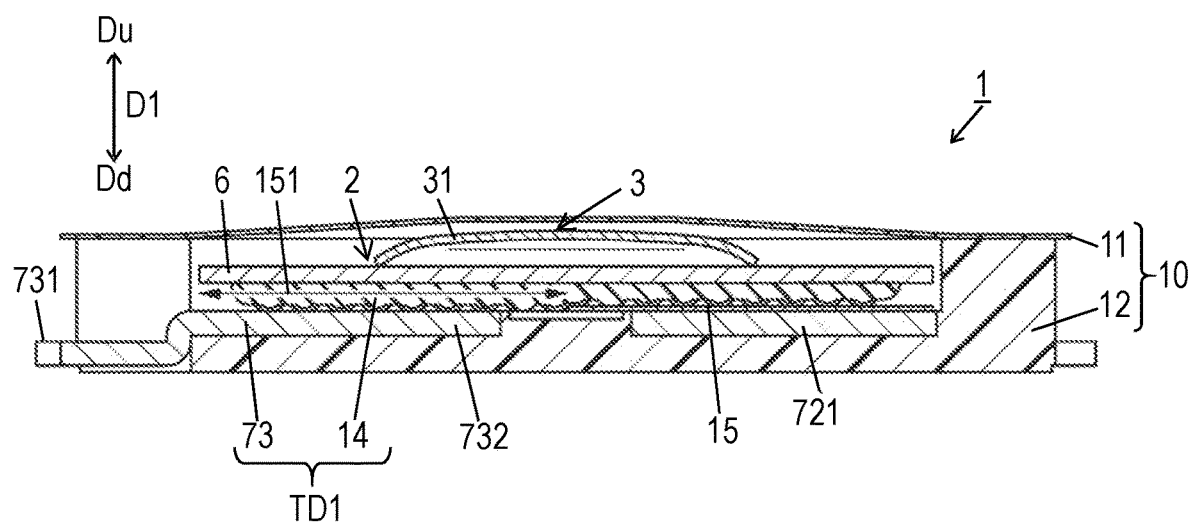
FIG. 6 is a schematic sectional view of the input device along line A2-A2 shown in FIG. 1.

FIG. 6 is a sectional view of input device 1 along line A2-A2 shown in FIG. 1. In pressure-sensitive part 2, as shown in FIG. 6, movable electrode 6 always electrically contacts fixed electrode 73 via electrically conductive elastic body 14 regardless of whether or not operation body U1 provides detection surface S0 of input device 1 with a manipulation. Electric signal SG3 containing a change in the electric potential of movable electrode 6 is transferred consecutively from movable electrode 6 to direct-connection line TD1 (elastic body 14 and fixed electrode 73) to output electric signal SG3 to the outside of input device 1 from terminal 731 of fixed electrode 73. A proximity, touch or pressing manipulation by operation body U1 on detection surface S0 causes operation body U1 and movable electrode 6 to form a capacitor in between to be capacitively coupled with each other. While operation body U1 continues the proximity, touch or pressing manipulation on detection surface S0, electric signal SG3 containing the change in the electric potential of movable electrode 6 contains a change in a capacitance of the above capacitor. Electric signal SG3 containing a change in the capacitance of the capacitor is output from terminal 731 to the outside of input device 1.

Figure 7A:
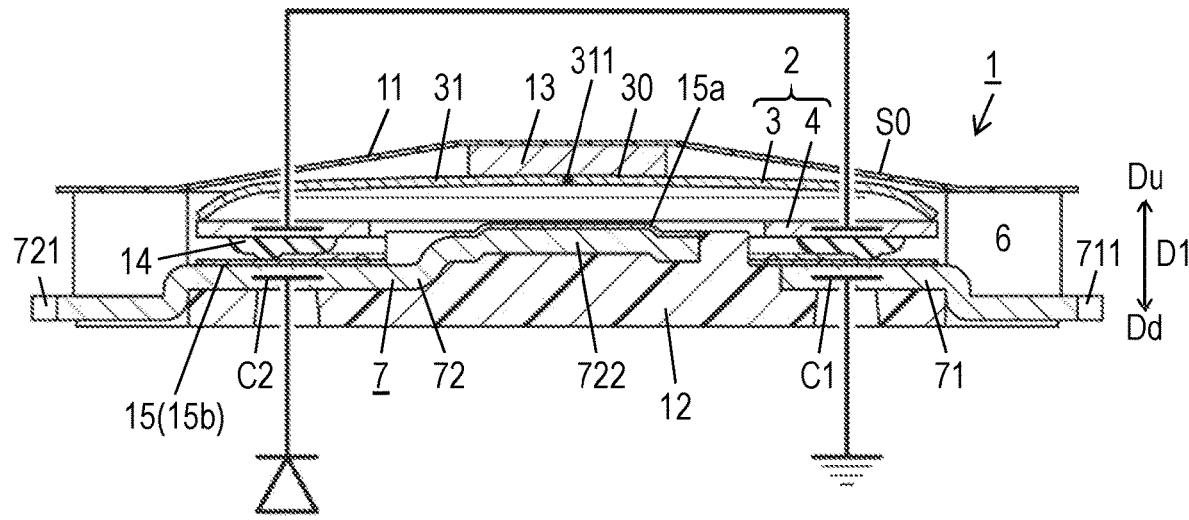
FIG. 7A is a schematic sectional view of the input device along line A3-A3 shown in FIG. 1.

FIG. 7A is a sectional view of input device 1 along line A3-A3 shown in FIG. 1 in which no pressing force by operation body U1 is applied to detection surface S0 of input device 1, or before the central portion of dome body 31 is buckled. In this state, capacitor C1 is formed between movable electrode 6 and fixed electrode 71, and capacitor C2 is formed between movable electrode 6 and fixed electrode 72. Capacitors C1 and C2 are connected in series to each other via conductive dome body 31.

Operation body U1 contacts detection surface 51 of detection surface S0 and presses click part 3 to compress elastic body 14, thereby changing the distance between movable electrode 6 and fixed electrode 7 and changing the areas of respective regions of movable electrode 6 and fixed electrode 7 facing each other. This configuration changes a total capacitance of capacitors C1 and C2 accordingly. Electric signal SG12 containing the change in the capacitance is output through terminals 711 and 721 to the outside of input device 1. In FIG. 7A, terminal 711 is grounded, thus constituting a grounding point, so that electrostatic charges stored in capacitors C1 and C2 flow into the grounding point. In FIG. 7A, the diode connected to one electrode of capacitor C2 visually illustrates that the electrostatic charges stored in capacitors C1 and C2 flow only to the grounding point, and does not actually exist.

Figure 7B:
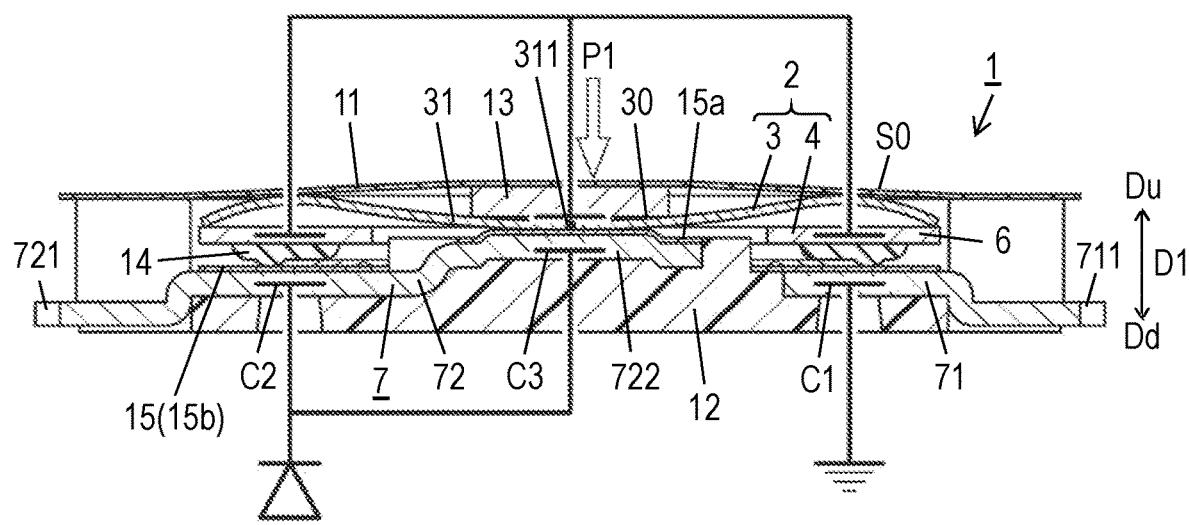
FIG. 7B is a schematic sectional view of the input device along the line A3-A3 shown in FIG. 1.

FIG. 7B is a sectional view of input device 1 along line A3-A3 shown in FIG. 1 in which a pressing force by operation body U1 is applied to detection surface S0 of input device 1, or after the central portion of dome body 31 is buckled. In this state, the central portion of dome body 31 contacts tongue 722 of fixed electrode 7 via central portion 15a of insulator 15. This situation will be referred to as an ON-state of a contact), so that dome body 31 and tongue 722 form capacitor C3. Capacitor C2 is connected in parallel to capacitor C3. After the ON-state of the contact is started, analog electric signal SG12 containing a change in the total capacitance of capacitors C1-C3 caused due to an additional load is output to the outside of input device 1 through terminals 711 and 721.

When pressing force P1 by operation body U1 is applied to pressing surface 30, click part 3 elastically deforms, as shown in FIG. 7B, to generate a click feeling that acts on operation body U1 as described above.

In accordance with the embodiment, an entire of the upper surface of main body 712 of fixed electrode 71 is an opposing region facing movable electrode 6, as shown in FIG. 4. Also, the entire upper surface of main body 723 of fixed electrode 72 is an opposing region that faces movable electrode 6. Also, the entire upper surface of main body 732 of fixed electrode 73 is an opposing region that facing movable electrode 6. Movable electrode 6 is indicated by dashed-double-dotted lines in FIG. 4. In accordance with the embodiment, the area of the opposing region of fixed electrode 71 is substantially equal to the sum of the area of the opposing region of fixed electrode 72 and the area of the opposing region of fixed electrode 73. This configuration provides input device 1 with preferable sensitivity in a pressure-sensitive range of pressure-sensitive part 2. The pressure-sensitive range is a possible range of depressed quantity in which operation body U1 is configured to press click part 3, or a range in which click part 3 is configured to deform from its normal, a convex shape to the buckled, a concave shape by the depression.

(2.3) Detection Part

Each of two detection parts 5 (5L, 5R) detects a proximity and a touch of detection surface S2 in detection surface S0 of input device 1 (see FIG. 1) by operation body U1. Each of two detection parts 5 is a capacitive sensor. Two detection parts 5 are disposed at opposite sides of pressure-sensitive part 2, respectively, when viewed from the upper surface of pressure-sensitive part 2 as shown in FIG. 3. In other words, two detection parts 5 are disposed at opposite sides of pressure detection part 2 in a direction intersecting upward and downward directions D1, or in a direction intersecting the movable direction of movable electrode 6. In accordance with the embodiment, two detection parts 5 are disposed at opposite sides of pressure detection part 2 in a direction perpendicular to upward and downward directions D1. In accordance with the embodiment, the direction intersecting upward and downward directions D1 is, for example, the longitudinal direction of housing 10. Two detection parts 5 are disposed adjacent to pressure-sensitive part 2. Two detection parts 5 have the same structure, but may not have the same structure.

Each detection part 5 includes auxiliary fixed electrode 50, as shown in FIG. 3. Detection part 5L includes auxiliary fixed electrode 50L. Detection part 5R includes auxiliary fixed electrode 50R. Each detection part 5 is a self-capacitive sensor including a single auxiliary fixed electrode 50, and detects a change in a capacitance generated between auxiliary fixed electrode 50 and operation body U1. Two auxiliary fixed electrodes 50 (50L, 50R) are fixed to two accommodating recesses 122 of body 12, respectively.

Auxiliary fixed electrode 50 (50L, 50R) is made of electrically conductive material, such as metal, and has a rectangular flat plate shape. Auxiliary fixed electrode 50 includes main body 52 and auxiliary terminal 51.

Auxiliary fixed electrode 50L includes main body 52L and auxiliary terminal 51L. Auxiliary fixed electrode 50R has includes main body 52R and auxiliary terminal 51R. Main body 52 (52L, 52R) has substantially a rectangular plate shape extending slenderly in the width direction perpendicular to both the longitudinal direction and the thickness direction of housing 10. Auxiliary terminal 51 (51L, 51R) is an output part outputting, the outside of input device 1, analog auxiliary electric signal SG0 (SG0L, SG0R) containing a change in a capacitance between auxiliary fixed electrode 50 (50L, 50R) and operation body U1. Auxiliary terminal 51 (51L, 51R) projects from one edge of main body 52 (52L, 52R) extended in the longitudinal direction of main body 52 (52L, 52R), or in the width direction of the housing. Auxiliary terminal 51 (51L, 51R) projects from main body 52 (52L, 52R) in a direction away from cover 11, and is further extended from main body 52 (52L, 52R) in a direction away from main body 52 (52L,52R) in the longitudinal direction of main body 52 (52L, 52R).

Each detection part 5 (50L, 50R), or each auxiliary fixed electrode 50 (50L, 50R), is accommodated in a corresponding accommodating recess 122 of body 12. In detail, main body 52 (52L, 52R) is disposed on the bottom surface of a corresponding accommodating recess 122 so that almost only the upper surface of main body 52 (52L, 52R) out of the surfaces of main body 52 (52L, 52R) is exposed from upper surface 120 of body 12 (see FIG. 3). The upper surface of main body 52 (52L, 52R) is substantially flush with upper surface 120. Auxiliary terminals 51L and 51R project to outside of body 12 from openings K1 and K3 formed in side surface 12*a* of body 12, respectively.

Each detection surface S2 of cover 11 has substantially a shape identical to that of upper surface of main body 52 of a corresponding auxiliary fixed electrode 50 to overlap the upper surface of main body 52 when viewed from the upper surface of cover 11. Operation body U1 approximating or contacting detection surface S2 of cover 11 causes auxiliary electric signal SG0 containing a change in a capacitance of capacitor C4 formed by auxiliary fixed electrode 50 and operation body U1 (see FIG. 5) to be output through auxiliary terminal 51. In FIG. 5, the grounding point connected with capacitor C4 denotes operation body U1. Also, in FIG. 5, the diode connected to one electrode of capacitor C4 visually illustrates that the electrostatic charges stored in capacitor C4 flow only toward the grounding point, and does not actually exist.

(2.4) Detection Circuit

Detection circuit 9 is electrically connected to input device 1, as shown in FIG. 2.

Detection circuit 9 is configured to obtain electric signals SG1 and SG2 output from terminals 711 and 721 of pressure sensor 4 of pressure-sensitive part 2, respectively. Detection circuit 9 is further configured to obtain electric signal SG3 output from terminal 731 of pressure sensor 4. Detection circuit 9 is further configured to obtain auxiliary electric signals SG0L and SG0R output from auxiliary terminals 51L and 51R of two detection parts 5L and 5R, respectively. Detection circuit 9 is configured to perform a proximity-detection process and/or a pressure-detection process based on the obtained electric signals. In the proximity-detection process, the detection circuit 9 detects whether or not operation body U1 approximates or contacts detection surface S0 of input device 1. In the pressure-detection process, the detection circuit detects whether or not operation body U1 presses detection surface S0 of input device 1. Detection circuit 9 determines a manipulation by operation body U1 to detection surface S0 based on a result of the proximity-detection process and the pressure-detection process, and outputs a result of the determination to the outside of input system 100, for example, to a circuit module in electronic equipment having input system 100 installed thereto.

Electric signals SG1, SG2, SG3, SG0L and SG0R output from terminals 711, 721, 731, 51L and 51R, respectively, will be expressed as electric signals SG1, SG2, SG3, SG0L and SG0R output from fixed electrodes 71, 72, 73, 50L and 50R, respectively, below.

Detection circuit 9 has plural detection modes. Detection circuit 9 selects one of the detection modes, and switches a processing from one of the proximity-detection process and the pressure-detection process based on the selected detection mode. Detection circuit 9 includes proximity detection circuit 91, pressure detection circuit 92, controller 93, and determination unit 94.

Proximity detection circuit 91 executes the proximity-detection process based on a control by controller 93. Pressure detection circuit 92 executes the pressure-detection process based on a control by controller 93. Controller 93 selects one detection mode from the detection modes, selects either one or both of proximity detection circuit 91 and pressure detection circuit 92 based on the selected detection mode, and causes the selected circuit to execute the corresponding process. In accordance with the embodiment, controller 93 has a switching function to switch a process between the pressure-detection process and the proximity-detection process.

The detection modes may include a Far mode, a Near mode, and a Touch mode. The Far mode and the Near mode are examples of the proximity-detection process. The Touch mode is an example of the pressure-detection process.

Figure 8A:
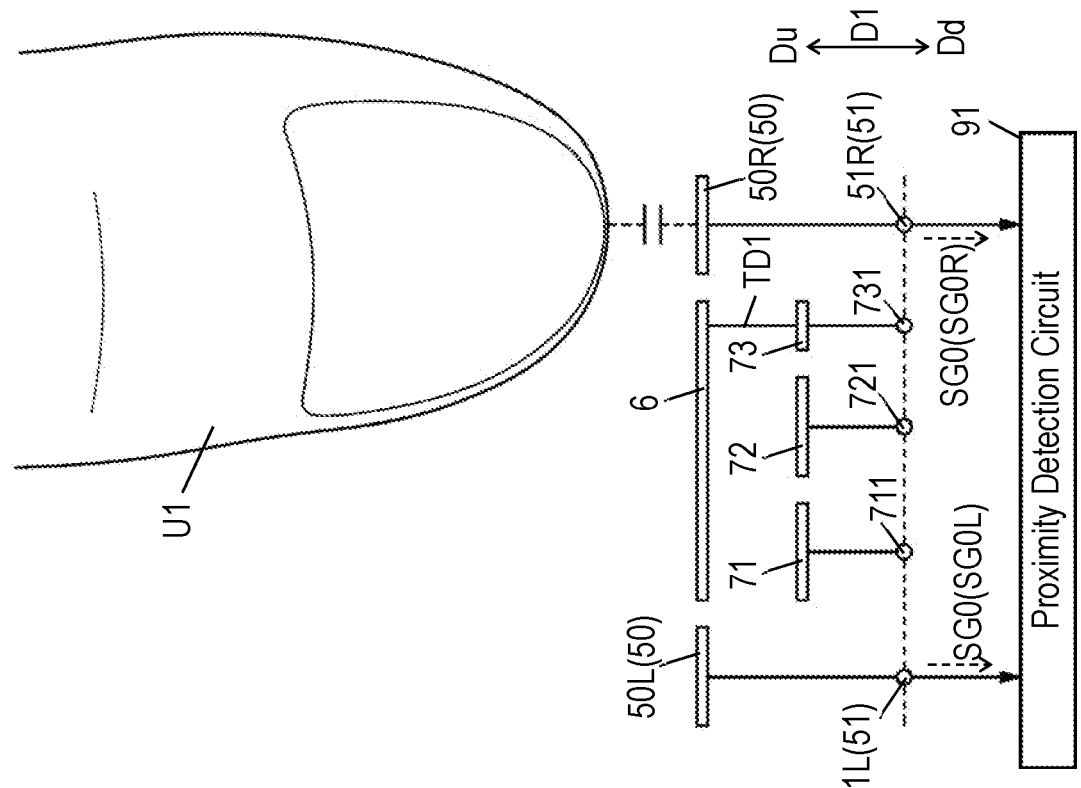
FIG. 8A schematically illustrates an operation of a proximity-detection process of the input system according to the embodiment.
Figure 8B:
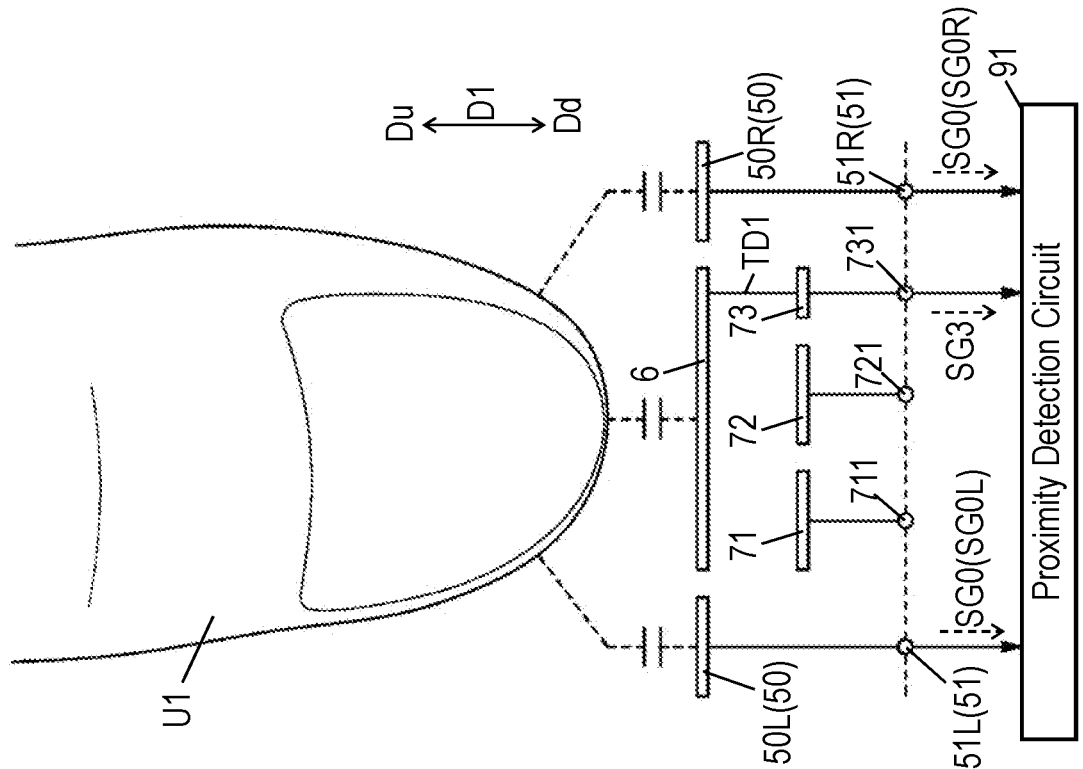
FIG. 8B schematically illustrates another operation of the proximity-detection process of the input system according to the embodiment.

First, the proximity-detection process will be described. FIGS. 8A and 8B schematically illustrates an operation of input system 100 in the proximity-detection process.

In the Far mode, a proximity or a contact of detection surface S0 by operation body U1 is detected in a case where operation body U1 approximates detection surface S0 from far away. This mode is executed by proximity detection circuit 91. In this mode, proximity detection circuit 91 executes the proximity-detection process employing both auxiliary fixed electrode 50 of detection part 5 and movable electrode 6 of pressure-sensitive part 2. In detail, as shown in FIG. 8A, proximity detection circuit 91 obtains electric signals SG0L, SG0R and SG3 from fixed electrodes 50L, 50R and 73, respectively, based on a control by controller 93. Then, proximity detection circuit 91 processes each of the obtained electric signals to detect whether or not operation body U1 approximates or contacts fixed electrodes 50L, 50R and 73. In this mode, since the proximity-detection process is executed employing both auxiliary fixed electrode 50 of detection part 5 and movable electrode 6 of pressure-sensitive part 2, the proximity or touch of detection surface S0 by operation body U1 is sensitively detected in the case where operation body U1 approximates detection surface S0 from far away. In this mode, the proximity-detection process is executed based on only electric signals SG0L, SG0R and SG3 from fixed electrodes 50L, 50R and 73 out of electric signals SG0L, SG0R, SG1, SG2 and SG3 from fixed electrodes 50L, 50R, 71, 72 and 73 not on electric signals SG1 and SG2 from fixed electrodes 71 and 72.

In the Near mode, the detection circuit detects a direction from which operation body U1 approximates. This mode is executed by proximity detection circuit 91. In this mode, proximity detection circuit 91 executes the proximity-detection process employing only detection part 5 of detection part 5 and pressure-sensitive part 2 without using pressure-sensitive part 2. In detail, as shown in FIG. 8B, proximity detection circuit 91 obtains electric signals SG0L and SG0R from fixed electrodes 50L and 50R, respectively, based on a control by controller 93. Then, proximity detection circuit 91 processes the obtained electric signals to detect whether or not operation body U1 approximates or contacting fixed electrodes 50L and 50R. In this mode, proximity detection circuit 91 opens the line from terminal 721. This configuration suppresses a stray capacitance between fixed electrodes 50L and 7 and a he stray capacitance between fixed electrodes 50R and 7, thereby increasing the detection sensitivity of detection parts 5L and 5R. As a result, the detection circuit detects sensitivity whether operation body U1 approximates to detection surface S1 from a direction on the side of auxiliary fixed electrode 50L or from a direction on the side of auxiliary fixed electrode 50R. In the case shown in FIG. 8B, operation body U1 in a direction on the side of auxiliary fixed electrode 50R. In this mode, proximity detection circuit 91 executes the proximity-detection process using only electric signals SG0L and SG0R from fixed electrodes 50L and 50R out of electric signals SG0L, SG0R, SG1, SG2 and SG3 from fixed electrodes 50L, 50R, 71, 72 and 73, without using electric signals SG1, SG2 and SG3 from fixed electrodes 71, 72 and 73.

Figure 9C:
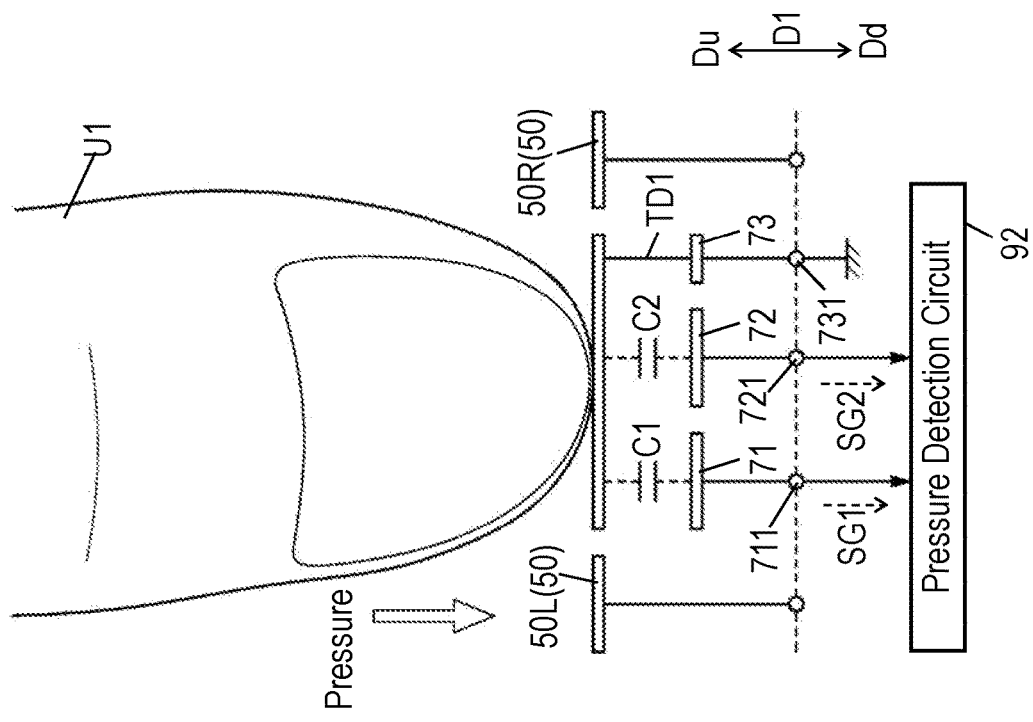
FIG. 9C schematically illustrates still another operation of the pressure-detection process of the input system according to the embodiment.

The pressure-detection process of input system 100 will be described below. FIGS. 9A-9C schematically illustrates operations of input system 100 in the pressure-detection process.

In the Touch mode, the detection circuit the input system executes the pressure-detection process. The Touch mode is executed by pressure detection circuit 92. In this mode, pressure detection circuit 92 executes the pressure-detection process based on electric signals SG1 and output SG2 from fixed electrodes 71 and 72, respectively.

The Touch mode includes a Touch mode #1, a Touch mode #2, and a Touch mode #3.

In the Touch mode #1, as shown in FIG. 9A, pressure detection circuit 92 consecutively connects terminal 731 to the ground and electrically connects terminals 711 and 721 to each other. Pressure detection circuit 92 executes the pressure-detection process based on electric signals SG1 and SG2 obtained from terminals 711 and 721 electrically connected to each other, respectively.

Terminals 711 and 721 connected to each other connects capacitor C1 formed by movable electrode 6 and fixed electrode 71 parallel to capacitor C2 formed by movable electrode 6 and fixed electrode 72. This configuration increases the sensitivity of pressure detection part 2 in the pressure-detection process. As a result, the detection circuit sensitively detects whether or not operation body U1 presses movable electrode 6. Since the line from terminal 731 is continuously grounded, the detection circuit sensitively detects whether or not operation body U1 presses movable electrode 6.

The Touch mode #2 is different from the Touch mode #1 in that terminals 711 and 721 are not connected to each other and that each of electric signals SG1 and SG2 from fixed electrodes 71 and 72 are processed individually (i.e., independently of each other). In detail, as shown in FIG. 9B, pressure detection circuit 92 continuously connects terminal 731 to the ground. Pressure detection circuit 92 alternately employs electric signals SG1 and SG2 from respective terminals 711 and 721 to execute the pressure-detection process on fixed electrodes 71 and 72. For example, pressure detection circuit 92 connects the line from terminal 721 to the ground to execute the pressure-detection process employing electric signal SG1 from terminal 711. On the other hand, pressure detection circuit 92 connects the line from terminal 711 to the ground to execute the pressure-detection process employing electric signal SG2 from terminal 721. FIG. 9B shows the state in which pressure detection circuit 92 executes the pressure-detection process employing electric signal SG2 from terminal 721 and connects the line from terminal 711 to the ground. In this mode, since terminal 731 is continuously grounded, the detection circuit sensitively detects whether or not operation body U1 presses movable electrode 6.

The Touch mode #3 is different from the Touch mode #2 in that both of electric signals SG1 and SG2 from fixed electrodes 71 and 72, respectively, are processed independently of each other. In detail, as shown in FIG. 9C, pressure detection circuit 92 continuously connects terminal 731 to the ground. Pressure detection circuit 92 obtains electric signals SG1 and SG2 from terminals 711 and 721 in parallel and independently of each other, and executes the pressure-detection process on fixed electrode 71 and the pressure-detection process on fixed electrode 72 in parallel. In this mode, since terminal 731 is continuously grounded, the detection circuit sensitively detects whether or not operation body U1 presses movable electrode 6.

Detection circuit 9 executes the proximity-detection process and the pressure-detection process in a time-divisional manner. In other words, controller 93 causes proximity detection circuit 91 and pressure detection circuit 92 to time-divisionally execute their respective detection processes. For example, controller 93 causes proximity detection circuit 91 to execute the proximity-detection process while causing pressure detection circuit 92 not to execute the pressure-detection process for 0.5 seconds within each of periodically repeated detection periods of 1 second, and then, causes pressure detection circuit 92 to execute the pressure-detection process while causing proximity detection circuit 91 not to execute the proximity-detection process for the remaining 0.5 seconds within each of the detection period.

When detection circuit 9 detects a proximity or a touch of detection surface S0 by operation body U1 in the proximity-detection process, detection circuit 9 changes the time-division processing to decrease the processing period of the proximity-detection process and increase the processing period of the pressure-detection process by the time corresponding to the decreased time of the proximity-detection process. In other words, when proximity detection circuit 91 detects a proximity or a touch of detection surface S0 by operation body U1, controller 93 decreases, in the time-division processing, the processing period of the proximity-detection process executed by proximity detection circuit 91 by a predetermined decreasing time. At this moment, controller 93 increases, in the time-division processing, the processing period of the pressure-detection process executed by pressure detection circuit 92 by the time corresponding to the predetermined decreasing time. For example, controller 93 causes proximity detection circuit 91 to execute the proximity-detection process while causing pressure detection circuit 92 not to execute the pressure-detection process for 0.1 seconds during each of periodically repeated detection periods of 1 second, and then, causes pressure detection circuit 92 to execute the pressure-detection process while causing proximity detection circuit 91 not to execute the proximity-detection process for the remaining 0.9 seconds.

The reason for this control is because, after operation body U1 approximates or contacts detection surface S0, operation body U1 tends to press detection surface S0, and thus, it is reasonable to change the time-division processing to put more weight on the pressure-detection process. In this manner, the detection circuit effectively executes the proximity-detection process and the pressure-detection process depending on the manipulation of operation body U1.

In accordance with the embodiment, as described above, after detecting a proximity or a touch of detection surface S0 by operation body U1 in the proximity-detection process, detection circuit 9 is configured to decrease the processing period of the proximity-detection process in the time-division processing by a predetermined decreasing time and increase the processing period of the pressure-detection process by the predetermined decreasing time. However, after detecting a proximity or a touch of detection surface S0 by operation body U1 in the proximity-detection process, detection circuit 9 may stop the time-division processing to execute only the pressure-detection process out of the proximity-detection process and the pressure-detection process without executing the proximity-detection process. In other words, when proximity detection circuit 91 detects a proximity or a touch of detection surface S0 by operation body U1, controller 93 may stop the time-division processing and cause only pressure detection circuit 92 out of proximity processing circuit 91 and pressure detection circuit 92 to execute the pressure-detection process without causing proximity detection circuit 91 to execute the proximity-detection process.

Determination unit 94 determines various manipulations (operation inputs) of operation body U1 based on combinations of detection results of proximity detection circuit 91 and pressure detection circuit 92. The above determination results may include a touch, a push, and a click on pressure-sensitive part 2 and a touch on each detection part 5. The push on pressure-sensitive part 2 is larger in load (larger in the change capacitance) than the touch, which means that the contact point does not reach the ON-state, or the state of generating the click feeling. The above manipulations include a moving direction of operation body U1 with respect to pressure detection part 2.

FIGS. 10A to 10D schematically illustrates manipulations of operation body U1 on input device 1. In FIGS. 10A to 10D, operation plate T1 is positioned above pressure-sensitive part 2 and detection part 5 of input device 1. Projection T10 projecting toward pressure-sensitive part 2 is provided on the lower surface of operation plate T1. The manipulations include a state regarding at least one of a first operation process and a second operation process that will be described below. In the first operation process, operation body U1 approximates detection surface S0 until giving a pressing force (touch, push or click) to detection surface S0. In the second operation process, operation body U1 moves away from detection surface S0 after giving the pressing force to detection surface S0. The manipulations include the following seven manipulations. Operation plate T1 may be employed in the following description, but may not necessarily be employed.

Figure 10B:
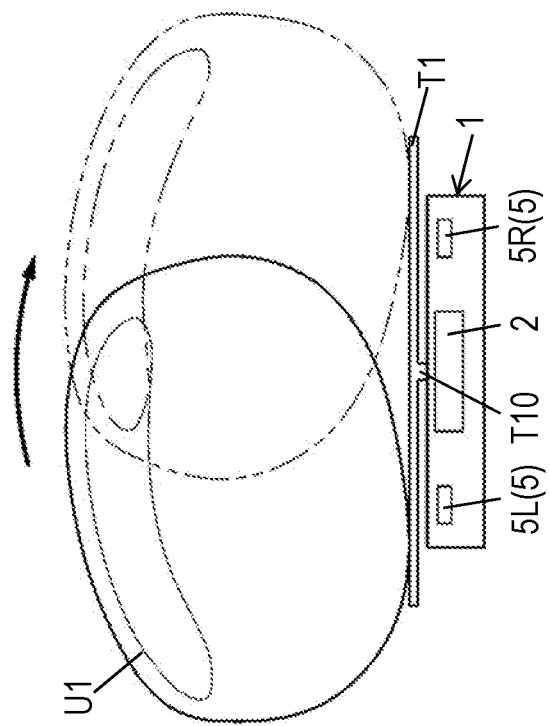
FIG. 10B schematically illustrates another manipulation of the operation body on the input device according to the embodiment.
Figure 10A:
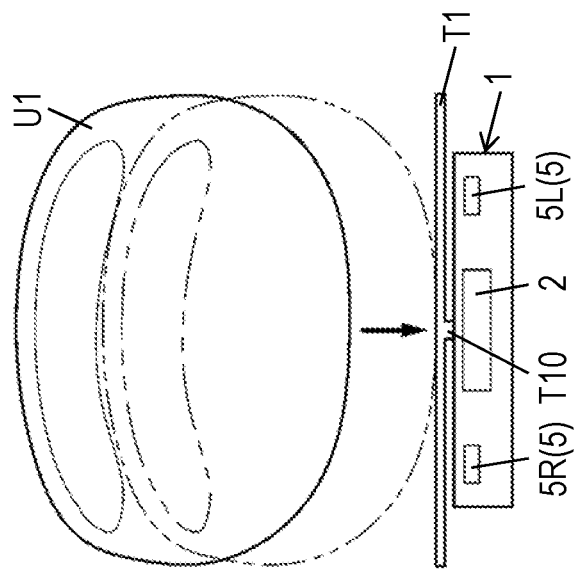
FIG. 10A schematically illustrates a manipulation of the operation body on the input device according to the embodiment.

A first manipulation is a series of manipulations in which, as shown in FIG. 10A, operation body U1 contacts two detection parts 5 (5L, 5R) via operation plate T1, e.g. substantially simultaneously, and clicks pressure detection part 2 via projection T10. A pressing force is applied to detection surface S1 by projection T10.

A second manipulation is a series of manipulations in which, as shown in FIG. 10B, operation body U1 first contacts, e.g. detection plate 5L on the left side among detection parts 5 and pressure-sensitive part 2 via operation plate T1, then clicks pressure-sensitive part 2 via projection T10, and then moves to the right along an arcuate locus about projection T10 to contact detection part 5R on the right side. The movement of operation body U1 along the arcuate locus causes operation plate T1 also slightly rotates in an arcuate locus about projection T10.

A third manipulation is a series of manipulations in which, oppositely to the second manipulation, operation body U1 moves along an arcuate locus to contact, via operation plate T1, e.g. detection part 5R on the right side and detection part 5L on the left side in this order.

Figure 10D:
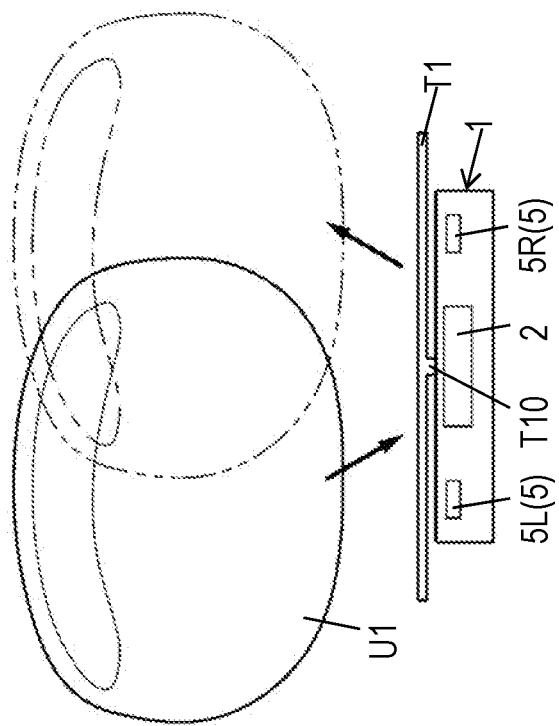
FIG. 10D schematically illustrates a further manipulation of the operation body on the input device according to the embodiment.
Figure 10C:
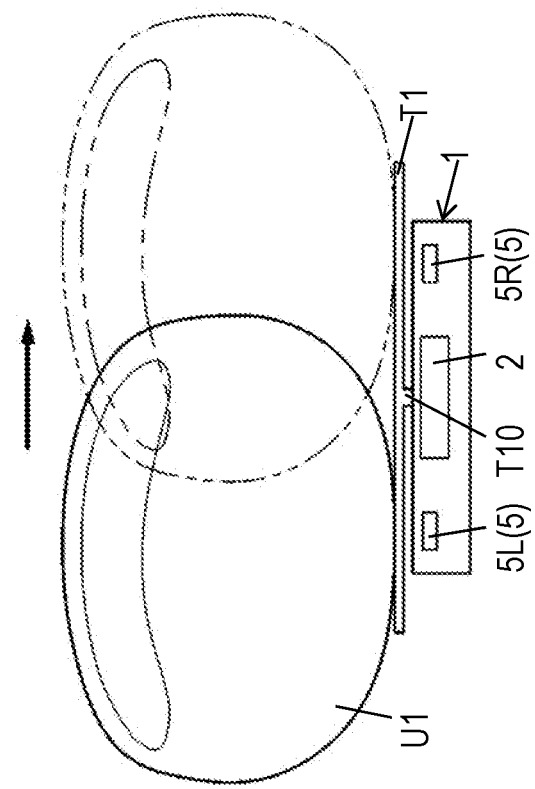
FIG. 10C schematically illustrates still another manipulation of the operation body on the input device according to the embodiment.

A fourth manipulation is a series of manipulations in which, as shown in FIG. 10C, operation body U1 contacts detection parts 5 and pressure-sensitive part 2 via operation plate T1 by, e.g. sliding on the upper surface of operation plate T1 in a direction from detection part 5L on the left side to pressure-sensitive part 2 and then to detection part 5R on the right side. That is, in the fourth manipulation, operation body U1 moves while contacting (or pushing) pressure-sensitive part 2 without the click operation.

A fifth manipulation is a series of manipulations in which, oppositely to the fourth manipulation, operation body U1 contacts detection parts 5 and pressure-sensitive part 2 via operation plate T1 by, e.g. substantially sliding on the upper surface of operation plate T1 in a direction from detection part 5R on the right side to detection part 5L on the left side.

As described above, determination unit 94 determines not only types of manipulations (touch, push and click) on pressure-sensitive part 2, but also the directions of the manipulations (the order of the manipulations) including the direction from which operation body U1 approximates pressure-sensitive part 2 (from right, left, and above in the illustrated examples) and the direction in which operation body U1 then moves away from pressure-sensitive part 2.

A sixth manipulation is a series of manipulations in which, as shown in FIG. 10D, operation body U1 moves from a position directly above detection part 5L on the left side in an obliquely lower direction to pressure-sensitive part 2 to click pressure-sensitive part 2 via operation plate T1 and projection T10, and then further moves in an obliquely upward direction to a position directly above detection part 5R on the right side (the hovering operation). That is, in this manipulation, operation body U1 moves substantially on a V-shape locus.

A seventh manipulation is a series of manipulations in which, oppositely to the sixth manipulation, operation body U1 moves from a position directly above detection part 5R on the right side in an obliquely lower direction to pressure-sensitive part 2 to click pressure-sensitive part 2 via operation plate T1 and projection T10, and then, further moves in an obliquely upward direction to a position directly above detection part 5L on the left side.

In the sixth and seventh manipulations, determination unit 94 does not determine which of detection parts 5L and 5R operation body U1 contacts but determines from which of detection parts 5L and 5R operation body U1 approximates pressure-sensitive part 2 or to which of detection parts 5L and 5R operation body U1 moved away from pressure-sensitive part 2.

In an eighth manipulation, operation body U1 is tilted leftward to be positioned above detection part 5L on the left side and pressure-sensitive part 2 but not above detection part 5R. In a ninth manipulation, oppositely to the eighth manipulation, operation body U1 is tilted rightward to be positioned above detection part 5R on the right side and pressure-sensitive part 2 but not above detection part 5L. That is, in the eighth and ninth manipulations, determination unit 94 determines a deviation direction of operation body U1, or toward which of the left-side and right-side detection parts 5 operation body U1 is deviated to press pressure-sensitive part 2.

Each of the proximity of, the touch of, and the push of detection surface S0 by operation body U1 is one of manipulations.

(3) Modifications

The exemplary embodiment described above is merely one of various exemplary embodiments of the present disclosure. The above-described exemplary embodiment may be modified variously depending on the design and the like as far as an object of the present disclosure can be achieved. Hereinafter, some modifications of the above-described exemplary embodiment will be described. The modifications described below may be applied in appropriate combinations. The above-described exemplary embodiment will be referred to as "the basic example".

(3.1) Modification 1

Figure 11:
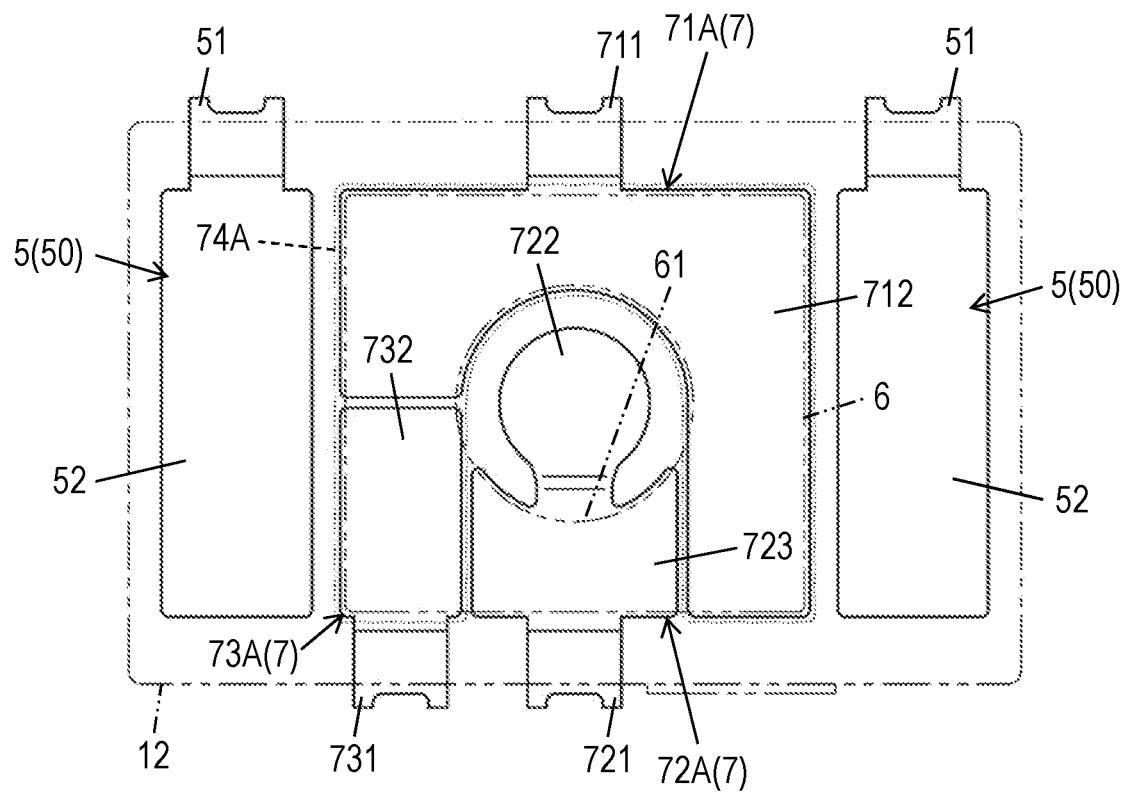
FIG. 11 is a plan view of a fixed electrode of an input device according to Modification 1 of the embodiment.

FIG. 11 is a plan view of fixed electrode 7 of input device 1 according to a first modification of the exemplary embodiment. This modification is different from the basic example in the shapes of fixed electrodes 71A, 72A and 73A. In detail, main body 712 of fixed electrode 71A in the present modification has a plate shape substantially with a J-shape, as shown in FIG. 11. Terminal 711 of fixed electrode 71A has the same structure as the basic example. Tongue 722 and terminal 721 of fixed electrode 72A have the same structures of the basic example. Main body 723 of fixed electrode 72A is configured to fit in a space which is not occupied by the J-shaped portion of fixed electrode 71A without contacting fixed electrode 71A. Fixed electrode 73A has the same structure as the basic example. Fixed electrode 73A is disposed in an empty space beyond the tip of the J-shape of main body 712 of fixed electrode 71A and beside fixed electrode 72A.

In the modification, similarly to the basic example, fixed electrode 7 includes fixed electrodes 71A and 74A, and fixed electrode 74A is composed of fixed electrodes 72A and 73A.

In this modification, the entire upper surface of main body 712 of fixed electrode 71A is an opposing region facing movable electrode 6 in upward and downward directions D1, as shown in FIG. 11. The entire upper surface of main body 723 of fixed electrode 72A is an opposing region facing movable electrode 6 in upward and downward directions D1. The entire upper surface of main body 732 of fixed electrode 73A is an opposing region facing movable electrode 6 in upward and downward directions D1. In FIG. 11, movable electrode 6 is indicated by dotted lines. In this modification, the area of the opposing region of fixed electrode 71A is non-uniform, i.e., is not equal to the sum of the area of the opposing region of fixed electrode 72A and the area of the opposing region of fixed electrode 73A. This "non-uniformity" provides input device 1 with preferable sensitivity of pressure-sensitive part 2 in a pressure-sensitive range. Here, the pressure-sensitive range is a possible range of depressed quantity by which operation body U1 is configured to press click part 3, or a range in which click part 3 is configured to be reversed to a convex shape and further depressed.

(3.2) Modification 2

Figure 12A:
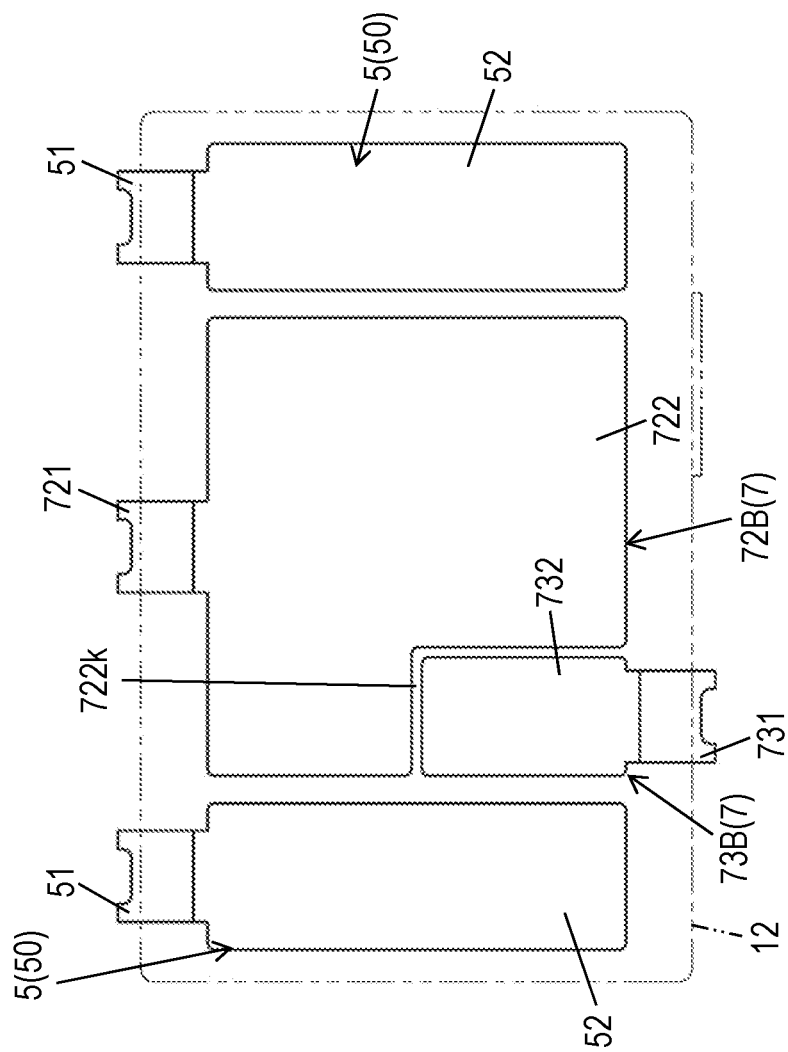
FIG. 12A is a plan view of a fixed electrode of an input device according to Modification 2 of the embodiment.

FIG. 12A is a plan view of fixed electrode 7 of input device 1 according to Modification 2 of the embodiment. This modification is different from the basic example in that fixed electrode 7 is composed of two fixed electrodes 72B and 73B. Fixed electrode 72B of this modification is an electrode obtained by unifying fixed electrodes 71 and 72 of the basic example. In detail, in this modification, main body 723 of fixed electrode 72B has substantially a rectangular plate shape, as shown in FIG. 12A. Cutout 722k having substantially a rectangular shape is provided in a corner of main body 723 of fixed electrode 72B. Terminal 721 of fixed electrode 72B has the same structure as that of the basic example. Main body 732 of fixed electrode 73B has substantially a rectangular shape so as to be fit in a space in cutout 722k without contacting cutout 722k. Terminal 731 of fixed electrode 73B has the same structure as that of the basic example.

Figure 12B:
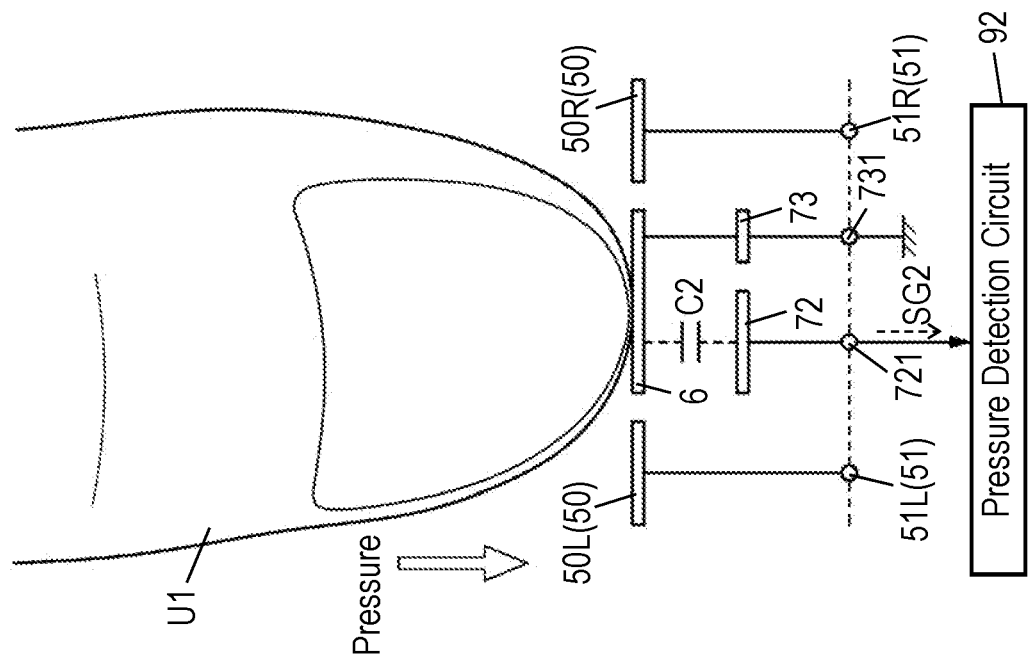
FIG. 12B schematically illustrates an operation of the input device according to Modification 2 of the embodiment.

FIG. 12B schematically illustrates an operation of input device 1 according to Modification 2. In the Touch mode according to this modification, as shown in FIG. 12B, pressure detection circuit 92 continuously connects terminal 731 to the ground and executes the pressure-detection process based on electric signal SG2 from terminal 721.

In this modification, fixed electrode 72B corresponds to an electrode obtained by combining fixed electrodes 71 and 72 of the basic example. Therefore, this modification does not have a gap corresponding to the gap between fixed electrodes 71 and 72 of the basic example. Accordingly, the area of fixed electrode 71B of this modification is larger than the sum of the areas of fixed electrodes 71 and 72 of the basic example. This configuration provides pressure detection part 2 in the pressure-detection process with larger sensitivity than the basic example.

(3.3) Other Modifications

Elastic body 14 of the basic example has an electrical conductivity. Elastic body 14 may have an electrical insulation property instead. In this case, elastic body 14 may preferably be made of material, such as dielectric elastomer, having a relatively high dielectric constant. In the case where elastic body 14 has an insulation property, input device 1 may not include insulator 15.

In the basic example, insulator 15 is disposed between elastic body 14 and fixed electrode 7. In this case, it is easy to perform a laminating process (lamination) to laminate insulator 15 on fixed electrode 7. However, this configuration may be modified. For example, the position of elastic body 14 and insulator 15 may be exchanged with each other such that elastic body 14 is disposed between insulator 15 and fixed electrode 7. In this case, it is easy to form elastic body 14 by using fixed electrode 7 as a reference.

In the basic example, insulator 15 is a sheet separated from body 12 and disposed between other two members, or between elastic body 14 and fixed electrode 7. However, insulator 15 may be formed unitarily with body 12. The upper wall of body 12 facing elastic body 14 may be a thin film wall entirely covering the surface of fixed electrode 7, and the thin film wall may function as an insulator.

In the basic example, the number of detection parts 5 is two, and two detection parts 5 are disposed on both sides, or the left and right sides, of pressure-sensitive part 2. However, the number of detection parts 5 may be one or three or more.

In the basic example, operation plate T1 is disposed on input device 1, and the operation input to input device 1 is made via operation plate T1. However, operation plate T1 may not be included, and the operation input to input device 1 may be made directly onto cover 11.

When the pressure sensor of the conventional input device is used to detect a proximity or a touch by the operation body, the above-described capacitance decreases sensitivity of the detection. Therefore, the pressure sensor hardly improves the sensitivity of detecting a proximity or a touch by a finger.

In contrast, the input device according to the embodiment improves the sensitivity of detecting a proximity or a touch by operation body U1, or a finger, as described above.

In the above embodiment, terms, such as "upper surface", "lower surface", "upward direction" and "downward direction", indicating directions indicate relative directions depending on a relative positional relationship between components of input device 1, and thus do indicate absolute directions, such as a vertical direction.

(4) Summary

Input device 1 configured to be operated by operation body U1 includes detection surface S0 configured to be operated by operation body U1, fixed electrode 71, movable electrode 6, terminals 711 and 731 configured to be connected to an outside of input device 1, and direct-connection line TD1. Movable electrode 6 has a lower surface facing an upper surface of fixed electrode 71 to be capacitively coupled to fixed electrode 71 and is displaceable to approach fixed electrode 71 in response to a pressing of detection surface S0 by operation body U1. Terminal 711 is configured to output, to the outside of input device 1, an electric signal SG1 containing a change in a capacitance between fixed electrode 71 and movable electrode 6. Terminal 731 is configured to output, from movable electrode 6 to the outside of input device 1, an electric signal SG3 containing a change in a capacitance between operation body U1 and movable electrode 6. Direct-connection line TD1 electrically connects movable electrode 6 to terminal 731 via no capacitor.

This configuration allows direct-connection line TD1 to output electric signal SG3 from movable electrode 6 to detection circuit 9 line TD1 without being affected by a capacitance. Accordingly, the device sensitively detects a proximity or a touch of detection surface S0 by operation body U1 based on electric signal SG3 from movable electrode 6. In other words, the device detects both a proximity and a touch of detection surface S0 by operation body U1 at a high sensitivity by using movable electrode 6.

Direct-connection line TD1 may include fixed electrode 73 having an upper surface facing a lower surface of movable electrode 6.

In this configuration, fixed electrode 73 may constitute direct-connection line TD1.

Input device 1 may further include insulator 15 between movable electrode 6 and the fixed electrode. Insulator 15 has cutout 151 provided therein. Direct-connection line TD1 may electrically connect movable electrode 6 to fixed electrode 73 through cutout 151.

This configuration secures electrical connection between movable electrode 6 and fixed electrode 73 with direct-connection line TD1 while securing insulation between movable electrode 6 and fixed electrode 72 by insulator 15.

Input device 1 may further include fixed electrode 72 and terminal 721 that is configured to be connected to the outside of input device 1. Fixed electrode 72 has an upper surface facing a lower surface of movable electrode 6 to be capacitively coupled to movable electrode 6. Terminal 721 is configured to output, to the outside of input device 1, an electric signal SG2 that contains a change in a capacitance between fixed electrode 72 and movable electrode 6. The area of a region of the upper surface of fixed electrode 71 facing the lower surface of movable electrode 6 is substantially identical to the sum of the area of a region of the upper surface of fixed electrode 71 facing the lower surface of movable electrode 6 and the area of a region the upper surface of fixed electrode 71 facing the lower surface of movable electrode 6.

The area of the region of the upper surface of fixed electrode 71 facing the lower surface of movable electrode 6 may be different from the sum of the area of the region of the upper surface of fixed electrode 71 facing the lower surface of movable electrode 6 and the area of the region of the upper surface of fixed electrode 71 facing the lower surface of movable electrode 6.

Input device 1 may further include one or more auxiliary fixed electrodes 50 and one or more auxiliary terminals 51 configured to be connected to the outside of input device 1. Each of the one or more auxiliary fixed electrodes 50 forms a capacitance between operation body U1 and the each of the one or more auxiliary fixed electrodes 50. Respective one of the one or more auxiliary terminals 51 is configured to output, to the outside of input device 1, respective of one or more auxiliary electric signals SG0 containing a change in the capacitance between the operation body U1 and the each of the one or more auxiliary fixed electrodes 50.

This configuration allows detection circuit 9 to sensitively detect a proximity or a touch of detection surface S0 by operation body U1 based on auxiliary electric signal SG0 from auxiliary fixed electrode 50. In other words, since the above-mentioned proximity and touch can be detected employing movable electrode 6 and auxiliary fixed electrode 50, it is possible to expand the substantial detection range of detection surface S0.

Input system 100 includes input device 1 and detection circuit 9. Detection circuit 9 is connected to terminal 711, terminal 731, and one or more auxiliary terminals 51 of input device 1.

Detection circuit 9 may be configured to detect whether or not operation body U1 approximates or contacts detection surface S0 based on electric signal SG3 and one or more auxiliary electric signals SG0 out of electric signal SG1, electric signal SG3 and one or more auxiliary electric signals SG0.

In this configuration, the system detects a proximity or a touch of detection surface S0 by operation body U1 employing movable electrode 6 and auxiliary fixed electrodes 50, or whole of the electrodes. Particularly in this case, the system sensitively detects a proximity of operation body U1 approximating detection surface S0 from a far distance.

Detection circuit 9 may detect whether or not operation body U1 approximates or contacts detection surface S0 based on only one or more auxiliary electric signals SG0 out of electric signal SG1, electric signal SG3 and one or more auxiliary electric signals SG0.

In this configuration, the system detects a proximity or a touch of detection surface S0 by operation body U1 employing auxiliary fixed electrode 50. Particularly in this case, the system effectively identifies a direction from which operation body U1 approximates detection surface S0.

Detection circuit 9 may be configured to execute a pressure-detection process to detect an operation of pressing detection surface S0 by operation body U1 based on electric signal SG1, to execute a proximity-detection process to detect a proximity or a touch of detection surface S0 by operation body U1 based on electric signal SG3, and to switch between the pressure-detection process and the proximity-detection process.

Detection circuit 9 may be configured to execute the pressure-detection process and the proximity-detection process repetitively in a time-divisional manner.

After detecting a proximity or a touch of detection surface S0 by operation body U1 by the proximity-detection process, the detection circuit 9 may decrease the time period for executing the proximity-detection process and increase the processing time period for executing the pressure-detection process.

In this configuration, after detecting a proximity or a touch of detection surface S0 by operation body U1 by the proximity-detection process, detection circuit 9 can focus on the pressure-detection process.

After detecting a proximity or a touch of detection surface S0 by operation body U1 by the proximity-detection process, the detection circuit 9 may decrease the time period for executing the proximity-detection process by a predetermined decreasing time and increase the processing time period for executing the pressure-detection process by the predetermined decreasing time.

After having detected a proximity or a touch of detection surface S0 by operation body U1 by the proximity-detection process, the detection circuit 9 may execute only the pressure-detection process without executing the proximity-detection process.

REFERENCE MARKS IN THE DRAWINGS 1 input device
6 movable electrode
9 detection circuit
15 insulator
50 auxiliary electrode
51 auxiliary terminal
71, 71A fixed electrode (first fixed electrode)
72, 72A, 72B fixed electrode (third fixed electrode)
73, 73A, 73B fixed electrode (second fixed electrode)
711 terminal (first terminal)
721 terminal (third terminal)
731 terminal (second terminal)
100 input system
S0 detection surface
SG1 electric signal (first electric signal)
SG2 electric signal (third electric signal)
SG3 electric signal (second electric signal)
SG0, SG0L, SG0R auxiliary electric signal
TD1 direct-connection line
U1 operation body

The invention claimed is:

1. An input device configured to be operated by an operation body, the input device comprising:
   a detection surface configured to be operated by the operation body;
   a first fixed electrode;
   a movable electrode having a lower surface facing an upper surface of the first fixed electrode and being capacitively coupled to the first fixed electrode, the movable contact being displaceable to approach the first fixed electrode in response to a pressing of the detection surface by the operation body;
   a first terminal configured to be connected to an outside of the input device and to output to the outside of the input device, a first electric signal containing a change in a capacitance between the first fixed electrode and the movable electrode;
   a second terminal configured to be connected to the outside of the input device and to output, from the movable electrode to the outside of the input device, a second electric signal containing a change in a capacitance between the operation body and the movable electrode; and
   a direct-connection line electrically connecting the movable electrode to the second terminal via no capacitor.

2. The input device of claim 1, wherein the direct-connection line includes a second fixed electrode having an upper surface facing the lower surface of the movable electrode.

3. The input device of claim 2, further comprising
   an insulator that intervenes between the movable electrode and the first fixed electrode, wherein
   the insulator has a cutout provided therein, and
   the direct-connection line electrically connects the movable electrode to the second fixed electrode through the cutout.

4. The input device of claim 2, further comprising:
   a third fixed electrode having an upper surface facing the lower surface of the movable electrode, the third fixed electrode being capacitively coupled to the movable electrode; and
   a third terminal configured to be connected to the outside of the input device and to output, to the outside of the input device, an electric signal containing a change in a capacitance between the third fixed electrode and the movable electrode, wherein
   an area of a region of the upper surface of the first fixed electrode facing the lower surface of the movable electrode is substantially identical to a sum of an area of a region of the upper surface of the second fixed electrode facing the lower surface of the movable electrode and an area of a region of the upper surface of the third fixed electrode facing the lower surface of the movable electrode.

5. The input device of claim 2, further comprising:
   a third fixed electrode having an upper surface facing the lower surface of the movable electrode, the third fixed electrode being capacitively coupled to the movable electrode; and
   a third terminal configured to be connected to the outside of the input device and to output, to the outside of the input device, an electric signal containing a change in a capacitance between the third fixed electrode and the movable electrode, wherein
   an area of a region of the upper surface of the first fixed electrode facing the lower surface of the movable electrode is different from a sum of an area of a region of the upper surface of the second fixed electrode facing the lower surface of the movable electrode and an area of a region of the upper surface of the third fixed electrode facing the lower surface of the movable electrode.

6. The input device of claim 1, further comprising:
   one or more auxiliary fixed electrodes, each of the one or more auxiliary fixed electrodes forming a capacitance between the operation body and the each of one or more auxiliary fixed electrodes; and
   one or more auxiliary terminals configured to be connected to the outside of the input device and output one or more auxiliary electric signals to the outside of the input device, respectively, the respective one of the one or more auxiliary electric signals containing a change in the capacitance between the operation body and the each of the one or more auxiliary fixed electrodes.

7. An input system comprising:
   the input device of claim 6; and
   a detection circuit connected to the first terminal, the second terminal and the one or more auxiliary terminals of the input device.

8. The input system of claim 7, wherein the detection circuit is configured to detect whether or not the operation body approximates or contacts the detection surface based on only the second electric signal and the one or more auxiliary electric signals out of the first electric signal, the second electric signal and the one or more auxiliary electric signals.

9. The input system of claim 7, wherein the detection circuit is configured to detect whether or not the operation body approximates or contacts the detection surface based on only the one or more auxiliary electric signals out of the first electric signal, the second electric signal and the one or more auxiliary electric signals.

10. The input system of claim 7, wherein the detection circuit is configured to:
execute a pressure-detection process to detect the pressing of the detection surface by the operation body based on the first electric signal;
execute a proximity-detection process to detect approximating or contacting the detection surface the operation body based on the second electric signal; and
switch between the pressure-detection process and the proximity-detection process.

11. The input system of claim 10, wherein the detection circuit is configured to execute the pressure detection process and the proximity-detection process repetitively in a time-divisional manner.

12. The input system of claim 11, wherein, after detecting approximating or contacting the detection surface by the operation body by the proximity-detection process, the detection circuit is configured to decrease a time for executing the proximity-detection process and increase a time for executing the pressure-detection process.

13. The input system of claim 12, wherein, after detecting approximating or contacting the detection surface by the operation body by executing the proximity-detection process, the detection circuit is configured to decrease the time for executing the proximity-detection process by a predetermined decreasing time and increase the time for executing the pressure-detection process by the predetermined decreasing time.

14. The input system of claim 11, wherein, after detecting approximating or contacting the detection surface by the operation body by executing the proximity-detection process, the detection circuit is configured to execute the pressure-detection process and not to execute the proximity-detection process.

* * * * *